US012740136B2

(12) United States Patent
Yang et al.

(10) Patent No.: US 12,740,136 B2
(45) Date of Patent: Sep. 15, 2026

(54) SEMICONDUCTOR DEVICE STRUCTURE HAVING GATE DIELECTRIC LAYERS WITH DIFFERENT DIELECTRIC COMPOSITIONS AND METHOD OF FORMING THE SAME

(71) Applicant: MEDIATEK INC., Hsinchu City (TW)

(72) Inventors: Yu-Lin Yang, Hsinchu City (TW); Ming-Cheng Lee, Hsinchu City (TW); Yuan-Fu Chung, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 710 days.

(21) Appl. No.: 17/816,749

(22) Filed: Aug. 2, 2022

(65) Prior Publication Data

US 2023/0061138 A1 Mar. 2, 2023

Related U.S. Application Data

(60) Provisional application No. 63/253,151, filed on Oct. 7, 2021, provisional application No. 63/240,007, filed on Sep. 2, 2021.

(51) Int. Cl.
*H10D 84/83* (2025.01)
*H10D 64/27* (2025.01)
(Continued)

(52) U.S. Cl.
CPC ........... *H10D 84/83* (2025.01); *H10D 64/514* (2025.01); *H10D 64/685* (2025.01);
(Continued)

(58) Field of Classification Search
CPC ............... H10D 64/514; H10D 64/691; H10D 84/0144; H10D 30/792; H10D 64/693;
(Continued)

(56) References Cited

U.S. PATENT DOCUMENTS 6,518,106 B2 * 2/2003 Ngai .................. H10D 84/0177 257/388
6,528,858 B1 * 3/2003 Yu ........................ H10D 64/685 257/E21.639

(Continued)

FOREIGN PATENT DOCUMENTS

DE 102021001414 A1 12/2021
TW 201125044 A 7/2011

(Continued)

OTHER PUBLICATIONS

German language office action dated Oct. 8, 2024, issued in application No. DE 10 2022 122 117.2.

(Continued)

*Primary Examiner* — Maliheh Malek
(74) *Attorney, Agent, or Firm* — McClure, Qualey & Rodack, LLP

(57) ABSTRACT

A semiconductor device structure includes a semiconductor substrate, a first device formed in the first region of the semiconductor substrate and a second device formed in the second region of the semiconductor substrate. The first device includes a first gate structure on the semiconductor substrate. The first gate structure includes a first gate dielectric layer on the semiconductor substrate and a first gate layer on the first gate dielectric layer. The second device includes a second gate structure on the semiconductor substrate. The second gate structure includes a second gate dielectric layer on the semiconductor substrate and a second gate layer on the second gate dielectric layer. The first gate dielectric layer of the first device and the second gate dielectric layer of the second device have different dielectric material compositions.

35 Claims, 12 Drawing Sheets

(51) Int. Cl.
*H10D 64/68* (2025.01)
*H10D 84/01* (2025.01)
*H10D 84/03* (2025.01)

(52) U.S. Cl.
CPC ....... *H10D 64/691* (2025.01); *H10D 84/0144* (2025.01); *H10D 84/038* (2025.01)

(58) Field of Classification Search
CPC .......... H10D 64/685; H01L 21/02142–02161; H01L 21/0214; H01L 21/0217; H01L 21/02321–02332; H01L 21/02197; H01L 21/022; H01L 21/02304; H01L 21/02362; H01L 21/3143–3145; H01L 21/3142
See application file for complete search history.

(56) References Cited

U.S. PATENT DOCUMENTS

| | | | | |
|---|---|---|---|---|
| 6,538,278 | B1 * | 3/2003 | Chau | H10D 84/0181 257/E21.639 |
| 7,105,889 | B2 * | 9/2006 | Bojarczuk, Jr. | H10D 64/685 257/E21.639 |
| 7,153,786 | B2 * | 12/2006 | Kim | C23C 16/40 438/785 |
| 7,348,636 | B2 * | 3/2008 | Ryu | H10D 84/85 257/369 |
| 7,732,872 | B2 * | 6/2010 | Cheng | H10D 64/01318 257/365 |
| 7,863,126 | B2 * | 1/2011 | Park | H10D 84/0181 257/E21.47 |
| 7,943,460 | B2 * | 5/2011 | Mo | H10D 84/0167 438/767 |
| 8,120,117 | B2 * | 2/2012 | Tsuchiya | H10D 84/0181 257/369 |
| 8,193,593 | B2 * | 6/2012 | Bai | H10D 64/685 257/411 |
| 8,212,322 | B2 * | 7/2012 | Frank | H10B 10/12 257/500 |
| 8,349,695 | B2 * | 1/2013 | Scheiper | H10D 84/0144 438/287 |
| 8,877,625 | B1 * | 11/2014 | Lian | H10D 84/0144 257/327 |
| 8,883,624 | B1 * | 11/2014 | Ramkumar | H10B 43/35 438/257 |
| 9,218,978 | B1 * | 12/2015 | Ramkumar | H10B 43/30 |
| 9,230,963 | B2 * | 1/2016 | Ji | H10D 64/01 |
| 9,349,742 | B2 * | 5/2016 | Wu | H10B 10/18 |
| 9,721,962 | B1 * | 8/2017 | Ramkumar | H10B 43/35 |
| 9,780,183 | B2 * | 10/2017 | Kim | H10D 84/014 |
| 9,793,286 | B2 * | 10/2017 | Wu | H10D 64/68 |
| 9,911,747 | B2 * | 3/2018 | Ramkumar | H10B 43/35 |
| 10,446,400 | B2 * | 10/2019 | Wang | H10D 64/01332 |
| 10,658,361 | B2 * | 5/2020 | Tsai | H10D 64/035 |
| 10,825,813 | B2 * | 11/2020 | Liao | H10D 84/014 |
| 11,024,639 | B2 * | 6/2021 | Abe | H10B 43/30 |
| 11,114,347 | B2 * | 9/2021 | Huang | H10D 64/017 |
| 11,374,109 | B2 * | 6/2022 | Pan | H10B 43/35 |
| 11,557,649 | B2 * | 1/2023 | More | H10D 84/0177 |
| 11,610,818 | B2 * | 3/2023 | Chen | H10D 84/038 |
| 11,616,059 | B2 * | 3/2023 | Woo | H10D 84/83 257/368 |
| 11,641,745 | B2 * | 5/2023 | Ramkumar | H10B 43/40 257/324 |
| 11,751,401 | B2 * | 9/2023 | Chen | H10B 51/30 257/295 |
| 11,949,012 | B2 * | 4/2024 | Park | H10D 64/689 |
| 12,015,066 | B2 * | 6/2024 | Chang | H10D 30/6735 |
| 12,142,530 | B2 * | 11/2024 | Wu | H10D 30/024 |
| 12,176,392 | B2 * | 12/2024 | Cheng | H10D 30/6757 |
| 12,183,802 | B2 * | 12/2024 | Li | H10D 64/667 |
| 12,433,014 | B2 * | 9/2025 | Tokranov | H10D 84/0144 |
| 2002/0153573 | A1 * | 10/2002 | Mogami | H10D 84/0165 257/E21.632 |
| 2005/0035345 | A1 * | 2/2005 | Lin | H10D 64/0134 257/20 |
| 2005/0145944 | A1 * | 7/2005 | Murthy | H10D 30/751 257/E21.639 |
| 2005/0156256 | A1 * | 7/2005 | Kim | C23C 16/40 257/410 |
| 2005/0269634 | A1 * | 12/2005 | Bojarczuk, Jr. | H10D 64/685 257/E21.639 |
| 2005/0280104 | A1 * | 12/2005 | Li | H10D 64/685 257/E21.639 |
| 2009/0181530 | A1 * | 7/2009 | Lisiansky | H10D 84/0181 257/E21.159 |
| 2010/0244207 | A1 * | 9/2010 | Takayanagi | H10D 64/691 438/761 |
| 2010/0276753 | A1 * | 11/2010 | Greene | H10D 84/0144 438/587 |
| 2010/0330761 | A1 * | 12/2010 | Oh | G11C 16/0475 257/E21.423 |
| 2011/0073964 | A1 * | 3/2011 | Chowdhury | H10D 64/685 257/E21.409 |
| 2013/0200445 | A1 * | 8/2013 | Lee | H10D 30/60 257/288 |
| 2013/0217195 | A1 * | 8/2013 | Li | H10D 64/01342 438/216 |
| 2014/0151710 | A1 * | 6/2014 | Lin | H10D 30/60 257/411 |
| 2016/0099253 | A1 * | 4/2016 | Ramkumar | H10D 64/037 257/326 |
| 2017/0194334 | A1 * | 7/2017 | Wu | H10B 43/35 |
| 2017/0194344 | A1 * | 7/2017 | Wu | H10D 64/037 |
| 2018/0019314 | A1 * | 1/2018 | Kim | H10D 64/667 |
| 2019/0157165 | A1 * | 5/2019 | Kim | H10D 84/0177 |
| 2021/0257258 | A1 * | 8/2021 | Huang | H10D 84/0144 |
| 2022/0102625 | A1 * | 3/2022 | Chandrasekaran | H10N 70/841 |
| 2022/0359690 | A1 * | 11/2022 | Iwata | H10D 64/512 |
| 2023/0067425 | A1 * | 3/2023 | Lin | H10D 30/43 |
| 2025/0006640 | A1 * | 1/2025 | Suzuki | H10W 20/075 |
| 2025/0029839 | A1 * | 1/2025 | Lin | H10D 64/0134 |
| 2026/0006805 | A1 * | 1/2026 | Tien | H10D 1/042 |

FOREIGN PATENT DOCUMENTS

| | | |
|---|---|---|
| TW | 201427009 A | 7/2014 |
| TW | 202121583 A | 6/2021 |

OTHER PUBLICATIONS

Chinese language office action dated May 26, 2023, issued in application No. TW 111133144.

* cited by examiner

SEMICONDUCTOR DEVICE STRUCTURE HAVING GATE DIELECTRIC LAYERS WITH DIFFERENT DIELECTRIC COMPOSITIONS AND METHOD OF FORMING THE SAME

CROSS REFERENCE TO RELATED APPLICATIONS

This application is based on, and claims priority of U.S. Provisional Application No. 63/240,007 filed on Sep. 2, 2021 and priority of U.S. Provisional Application No. 63/253,151 filed on Oct. 7, 2021, the entirety of which are incorporated by reference herein.

BACKGROUND OF THE INVENTION

Field of the Invention

The present invention relates to a semiconductor device structure and a method of forming the same, and in particular to a semiconductor device structure including devices having gate dielectric layers with different dielectric compositions and a method of forming the same.

Description of the Related Art

In recent years, as demand has increased for high-voltage devices, there has been an increasing interest in research on high-voltage metal oxide semiconductor (MOS) transistors for use in high-voltage devices. The high-voltage (HV) MOS devices for use under high voltages, which may be, but not limited to, voltages higher than the voltage supplied to the I/O circuit. MOS devices, such as HVMOS devices, may function as switches, and they are broadly utilized in audio output drivers, CPU power supplies, power management systems, AC/DC converters, LCD or plasma television drivers, automobile electronic components, PC peripheral devices, small DC motor controllers, and other consumer electronic devices.

Although existing semiconductor devices such as MOS devices and methods of forming the same have been adequate for their intended purposes, they have not been entirely satisfactory in all respects. For example, when several devices (such as HV devices) are fabricated on the same semiconductor substrate, the threshold voltages of the conventional devices typically relate to the conductive materials and configurations of the gate structures. It is difficult to delicately tune the threshold voltage of the device that includes the conventional gate structure. In addition, the process for forming the conventional gate structure is complicated, which leads to the mismatch between the conductive material layers in a stack of the gate structure. The structural variations between different gate structures on the semiconductor substrate would also be increased. Therefore, there are still some problems to be overcome in regards to provide several devices of a semiconductor device structure on the same semiconductor substrate in the semiconductor integrated circuits and technology.

BRIEF SUMMARY OF THE INVENTION

Some embodiments of the present disclosure provide semiconductor device structures. An exemplary embodiment of a semiconductor device structure includes a semiconductor substrate, a first device formed in the first region of the semiconductor substrate and a second device formed in the second region of the semiconductor substrate. The first device includes a first gate structure on the semiconductor substrate. The first gate structure includes a first gate dielectric layer on the semiconductor substrate and a first gate layer on the first gate dielectric layer. The second device includes a second gate structure on the semiconductor substrate. The second gate structure includes a second gate dielectric layer on the semiconductor substrate and a second gate layer on the second gate dielectric layer. The first gate dielectric layer of the first device and the second gate dielectric layer of the second device have different dielectric material compositions.

Some embodiments of the present disclosure provide a method of forming a semiconductor device structure. First, a semiconductor substrate having a first region and a second region is provided. The method also includes forming a first device in the first region and a second device in the second region. The first device includes a first gate structure on the semiconductor substrate. The second device includes a second gate structure on the semiconductor substrate. Forming the first gate structure includes forming a first gate dielectric layer on the semiconductor substrate and forming a first gate layer on the first gate dielectric layer. Forming the second gate structure includes forming a second gate dielectric layer on the semiconductor substrate and forming a second gate layer on the second gate dielectric layer. The first gate dielectric layer of the first device and the second gate dielectric layer of the second device have different dielectric material compositions.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
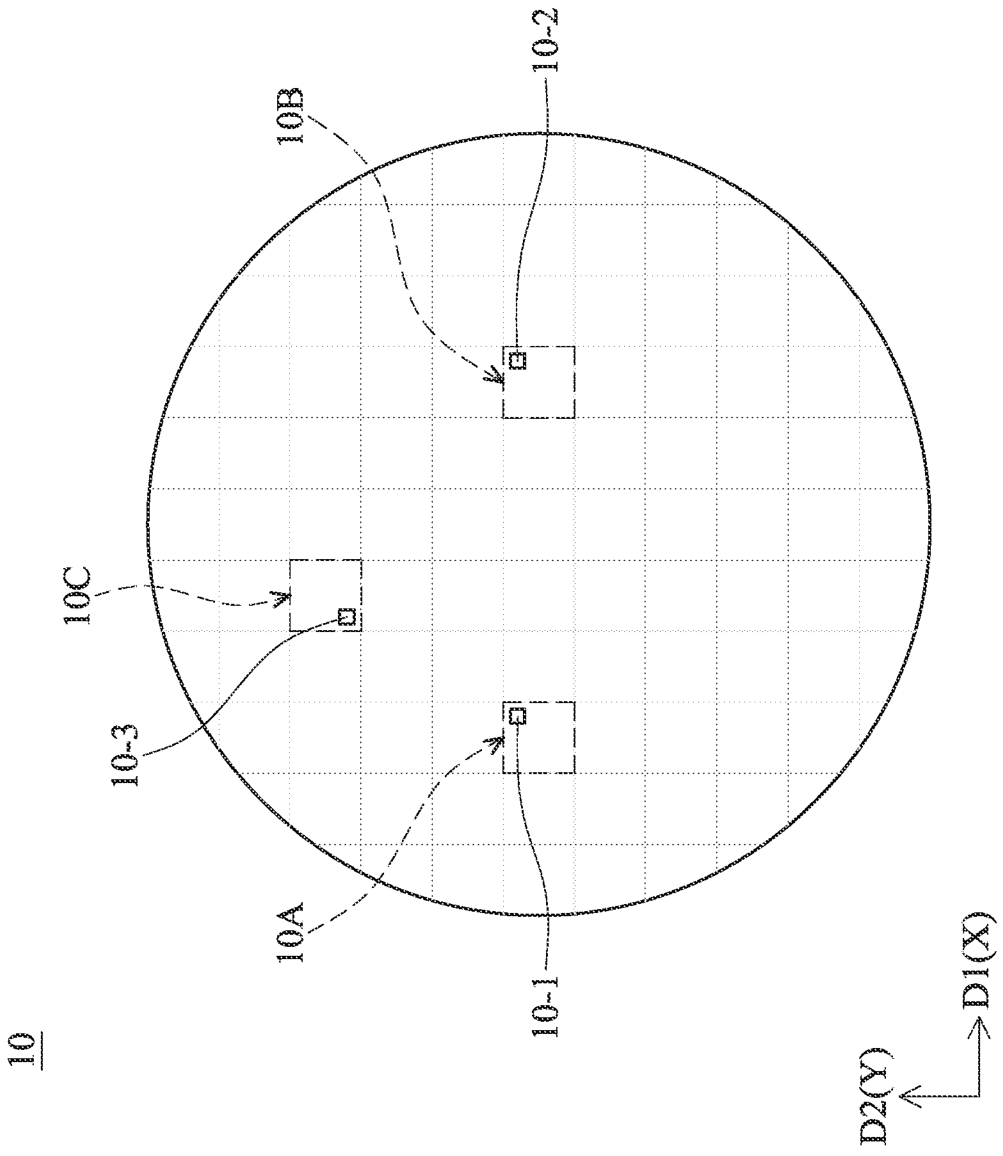
FIG. 1 is a top view of a semiconductor device structure, in accordance with some embodiments of the present disclosure.

The following description is of the best-contemplated mode of carrying out the invention. This description is made for the purpose of illustrating the general principles of the invention and should not be taken in a limiting sense. The scope of the invention is determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It should be understood that when an element is referred to as being "connected" or "contacting" to another element, it may be directly connected to or contacting the other element, or intervening elements may be present.

Similarly, it should be understood that when an element such as a layer, region or substrate is referred to as being "on" another element, it can be directly on the other element or intervening elements may be present. In contrast, the term "directly" means that there are no intervening elements. It should be understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Furthermore, spatially relative terms, such as "beneath", "below", "above", "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. It should be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same or similar reference numerals or reference designators denote the same or similar elements throughout the specification.

Some embodiments of the disclosure are described. It should be noted that additional procedures can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with procedures performed in a particular order, these procedures may be performed in another logical order.

According to some embodiments of the present disclosure, a semiconductor device structure and a method of forming the same are described below, wherein the semiconductor device structure includes devices having gate dielectric layers with different compositions. In some embodiments, the gate dielectric layer with one or more suitable dielectric materials (such as one or more high-k dielectric materials) is implemented in each of the gate structures of the devices can prevent the hot carrier injection (HCI) effect, thereby improving the electrical characteristics of the devices. Also, in some embodiments, different threshold voltages (Vt) of the devices (such as high-voltage devices) that are fabricated on the same semiconductor substrate 100 can be fine-tuned by adjusting the material composition and the dielectric constant of each of the gate dielectric layers. According to the embodiments, each of the devices can be operated in a suitable window of the hot carrier injection (HCI) lifetime and device resistance by flexible threshold voltages (Vt) offering, in accordance with some embodiments of the present disclosure. In addition, the semiconductor device structure and method of forming the same, in accordance with some embodiments, reduce the process complexity for forming the gate structure, thereby solving the conventional mismatch issue of the features (e.g. the mismatch between the conductive material layers in a stack of the gate structure) and improving the electrical characteristics of the devices.

Some of the methods of forming the semiconductor device structure in accordance with some embodiments of the present disclosure are provided below. It should be noted that the present disclosure is not limited to the exemplified methods and structures described herein. Those steps and structures described below are merely for providing examples of the fabrication and configuration of the semiconductor device.

FIG. 1 is a top view of a semiconductor device structure, in accordance with some embodiments of the present disclosure. In FIG. 1, a semiconductor device structure includes several devices (such as metal oxide semiconductor (MOS) transistors) formed in different regions of a semiconductor substrate (such as a wafer). For example, a first device 10-1 (e.g. a first MOS transistor) is formed in the first region 10A, a second device 10-2 (e.g. a second MOS transistor) is formed in the second region 10B, and a third device 10-3 (e.g. a third MOS transistor) is formed in the third region 10C. In addition, the devices (such as the first device, the second device and the third device) are high-voltage (HV) metal oxide semiconductor (MOS) devices, in accordance with some embodiments of the present disclosure.

FIG. 2A, FIG. 2B, FIG. 2C and FIG. 2D are cross-sectional views of intermediate stages of a method of forming a semiconductor device structure, in accordance with some embodiments of the present disclosure. In some embodiments, a semiconductor device structure that includes at least two devices is provided, and the gate dielectric layers of the two devices have different dielectric material compositions.

To simplify the diagram, only two devices are depicted herein. However, the number of devices is not limited thereto. Although lateral double-diffused MOS (LDMOS) devices are illustrated in FIG. 2A-FIG. 2D, the disclosure is not limited to the exemplified embodiment. Other types of the devices are also applicable. In addition, the planar LDMOS device is merely an example for illustrating the fabrication, and the present embodiment is not limited thereto. The semiconductor device structure may include planar transistors or three-dimensional transistors such as fin field-effect transistors (FinFETs).

In this example, a semiconductor device structure includes a first device 10-1 (e.g. a first MOS transistor) formed in the first region 10A and a second device 10-2 (e.g. a second MOS transistor) formed in the second region 10B, as shown in FIG. 1. Please refer to FIG. 1 and FIG. 2A.

Figure 2A:
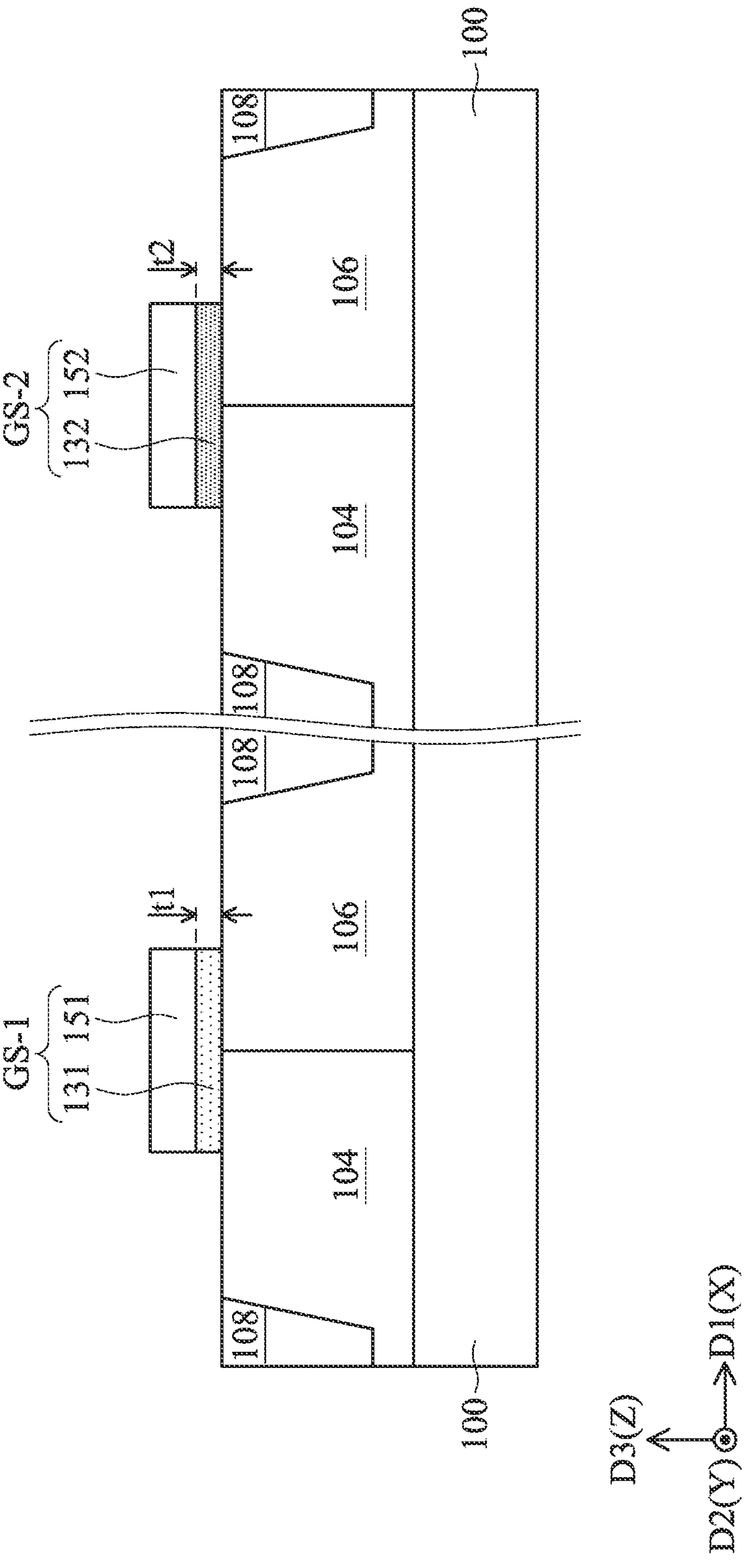
FIG. 2A, FIG. 2B, FIG. 2C and FIG. 2D are cross-sectional views of intermediate stages of a method of forming a semiconductor device structure, in accordance with some embodiments of the present disclosure.

Referring to FIG. 2A, in some embodiments, a portion of the first device 10-1 (FIG. 1) and a portion of the second device 10-2 (FIG. 1) are provided. First, a semiconductor substrate 100 that includes well regions and isolation regions 108 adjacent to the well regions is provided. The semiconductor substrate 100 may include well regions 104 having the first conductivity type such as P-type (also referred to as P-well regions 104). The semiconductor substrate 100 may include well regions 106 having the second conductive type such as N-type (also referred to as N-well regions 106).

The semiconductor substrate 100 may include a semiconductor wafer such as a silicon wafer. Alternatively, the semiconductor substrate 100 may include other elementary semiconductors such as germanium. The semiconductor substrate 100 may also include a compound semiconductor such as silicon carbide, gallium arsenic, indium arsenide, and indium phosphide. The semiconductor substrate 100 may include an alloy semiconductor such as silicon germanium, silicon germanium carbide, gallium arsenic phosphide, and gallium indium phosphide. In one embodiment, the semiconductor substrate 100 includes an epitaxial layer overlying a bulk semiconductor. In one embodiment, the semiconductor substrate 100 includes a semiconductor-on-insulator (SOI) structure. In some embodiments, the semiconductor substrate 100 may include a buried layer such as an n-type buried layer (NBL), a p-type buried layer (PBL), and/or a buried dielectric layer including a buried oxide (BOX) layer. In the present embodiment, high-voltage n-type MOS (HVNMOS) transistor structures are exemplified as the first device 10-1 and the second device 10-2, and the semiconductor substrate 100 has a first conductivity type, such as p-type silicon substrate. To form a complementary HVMOS (HVCMOS), an n-type buried layer, i.e., a deep N-well (DNW), may be implanted deeply under the active regions (such as under the P-well regions 104 and N-well regions 106) of the p-type HVMOS of the p-type silicon substrate (not shown).

In addition, the P-well regions 104 and N-well regions 106 may be portions of the semiconductor substrate 100, and may be formed by various ion implantation processes. Alternatively, the P-well regions 104 and N-well regions 106 may be portions of an epitaxy layer such as a silicon epitaxy layer formed by epitaxy processing. The P-well regions 104 may have a p-type dopant such as boron, and the N-well regions 106 may have an n-type dopant such as phosphorus.

In addition, the isolation regions 108 such as shallow trench isolation (STI) features or other suitable isolation features may be formed in the semiconductor substrate 100 to define and electrically isolate various active regions such as P-well regions 104 and N-well regions 106. In some embodiments, the isolation regions 108 that extend downward from the upper surface of the semiconductor substrate 100 are embedded in the semiconductor substrate 100. The isolation regions 108 may include silicon oxide, another suitable insulating material, or a combination thereof. In one example, the formation of STI features may include dry etching trenches in a substrate and filling the trenches with insulator materials such as silicon oxide, silicon nitride, or silicon oxynitride. Each of the filled trenches may have a multi-layer structure such as a thermal oxide liner layer and a filling material of silicon nitride or silicon oxide.

In some embodiments, each device includes a gate structure on the upper surface of the semiconductor substrate 100. As shown in FIG. 1 and FIG. 2A, a first gate structure GS-1 of the first device 10-1 and a second gate structure GS-2 of the second device 10-2 are formed on the upper surface of the semiconductor substrate 100. In this example, the first gate structure GS-1 is formed above the junction of the P-well region 104 and the N-well region 106 of the first device 10-1. Similarly, the second gate structure GS-2 is formed above the junction of the P-well region 104 and the N-well region 106 of the second device 10-2.

In some embodiments, the first gate structure GS-1 of the first device 10-1 includes a first gate dielectric layer 131 and a first gate layer 151 on the first gate dielectric layer 131. The second gate structure GS-2 of the second device 10-2 includes a second gate dielectric layer 132 and a second gate layer 152 on the second gate dielectric layer 132. The first gate structure GS-1 of the first device 10-1 may be formed by a photolithography process for patterning the material layers of the first gate dielectric layer 131 and the first gate layer 151. Similarly, the second gate structure GS-2 of the second device 10-2 may be formed by a photolithography process for patterning the material layers of the second gate dielectric layer 132 and the second gate layer 152. The first gate structure GS-1 in the first region 10A and the second gate structure GS-2 in the second region 10B may be spaced apart from each other in the first direction D1 (such as X-direction). In addition, in some embodiments, the first gate structure GS-1 and the second gate structure GS-2 extend in the second direction D2 (such as Y-direction). The first direction D1 is different from the second direction D2.

According to the present embodiments, the first gate dielectric layer 131 of the first gate structure GS-1 and the second gate dielectric layer 132 of the second gate structure GS-2 have different dielectric material compositions. In some embodiments, the first gate dielectric layer 131 has a first dielectric constant k1 and the second gate dielectric layer 132 has a second dielectric constant k2. The first dielectric constant k1 is different from the second dielectric constant k2. In one embodiment, the second dielectric constant k2 of the second gate dielectric layer 132 is greater than the first dielectric constant k1 of the first gate dielectric layer 131.

In some embodiments, the first gate dielectric layer 131 of the first gate structure GS-1 and the second gate dielectric layer 132 of the second gate structure GS-2 are high-k dielectric layers. The first dielectric constant k1 of the first gate dielectric layer 131 may be equal to or greater than 20. The second dielectric constant k2 of the second gate dielectric layer 132 may be equal to or greater than 20. In one example, the second dielectric constant k2 of the second gate dielectric layer 132 is greater than the first dielectric constant k1 of the first gate dielectric layer 131. According to the embodiment, the first high-k gate dielectric layer 131 of the first gate structure GS-1 prevents the carriers from passing through the high-k gate dielectric layer 131 and reaching the first gate layer 151. The second high-k gate dielectric layer 132 of the second gate structure GS-2 prevents the carriers from passing through the high-k gate dielectric layer 132 and reaching the second gate layer 152. In some embodiments, different chips on a wafer may include several devices that have gate dielectric layers made of different high-k dielectric materials to achieve their required threshold voltages (Vt) for the devices.

Material examples of the first gate dielectric layer 131 and the second gate dielectric layer 132 may include hafnium oxide (HfOx), lanthanum oxide (LaOx), or a combination thereof. In one example, the first gate dielectric layer 131 and the second gate dielectric layer 132 include (but not limited to) hafnium oxide (HfOx), lanthanum oxide (LaOx), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. It should be noted that the first gate dielectric layer 131 and the second gate dielectric layer 132 of the present disclosure is not limited to include the aforementioned materials.

In addition, each of the first gate dielectric layer 131 and the second gate dielectric layer 132 may include an interfacial layer (not shown) and a high-k dielectric layer formed on the interfacial layer. The interfacial layer (not shown), the high-k dielectric layer (e.g. the first gate dielectric layer 131 or the second gate dielectric layer 132) and the gate layer (e.g. the first gate layer 151 or the second gate layer 152) are stacked in the third direction D3 (such as Z-direction). In one example, the interfacial layer is formed on the semiconductor substrate 100 and includes a silicon oxide layer. The high-k dielectric layer (e.g. the first gate dielectric layer 131 or the second gate dielectric layer 132) may be formed on the interfacial layer by atomic layer deposition (ALD) or another suitable method. The gate layer (e.g. the first gate layer 151 or the second gate layer 152) is formed on the high-k dielectric layer.

In addition, the first gate dielectric layer 131 of the first gate structure GS-1 may be a single layer or a multi-layered structure. Similarly, the second gate dielectric layer 132 of the second gate structure GS-2 may be a single layer or a multi-layered structure. In this example, as shown in FIG. 2A-FIG. 2D, the first gate dielectric layer 131 is a single dielectric material layer, and the second gate dielectric layer 132 is also a single dielectric material layer for clear illustrations of this embodiment. However, the present disclosure is not limited to the configurations of the first gate dielectric layer 131 and the second gate dielectric layer 132 in FIG. 2A-FIG. 2D. In some other embodiments, the first gate dielectric layer 131 is a single dielectric material layer, and the second gate dielectric layer 132 includes several dielectric material layers (e.g. the second gate dielectric layer 132-1 includes two dielectric material layers **132*a* and 132*b*, as shown in FIG. 3, and will be described later). In some other embodiments, the first gate dielectric layer 131 and the second gate dielectric layer 132** each includes several dielectric material layers.

In addition, in some embodiments, the first gate dielectric layer 131 and the second gate dielectric layer 132 have a different number of dielectric material layers. In some other embodiments, the first gate dielectric layer 131 and the second gate dielectric layer 132 include the same number of dielectric material layers. The number of dielectric material layers in the first gate dielectric layer 131 and the second gate dielectric layer 132 are not limited in the present disclosure.

In addition, as shown in FIG. 2A, the first gate dielectric layer 131 of the first gate structure GS-1 has a first thickness t1 and the second gate dielectric layer 132 of the second gate structure GS-2 has a second thickness t2. In some embodiments, the first thickness t1 is equal to the second thickness t2. In some other embodiments, the first thickness t1 is different from the second thickness t2. The first thickness t1 of the first gate dielectric layer 131 may be in a range from about 1 angstrom to about 50 angstrom. The second thickness t2 of the second gate dielectric layer 132 may be in a range from about 1 angstrom to about 50 angstrom. It should be noted that those numerical values of the first gate dielectric layer 131 and the second gate dielectric layer 132 are provided for exemplification, and the present disclosure is not limited thereto. Any suitable numerical values of the first thickness t1 of the first gate dielectric layer 131 and the second thickness t2 of the second gate dielectric layer 132 may be applicable, depending on the design requirements.

In some embodiments, the first gate layer 151 of the first gate structure GS-1 and the second gate layer 152 of the second gate structure GS-2 include one or more conductive materials. The first gate layer 151 can be referred to as a first gate electrode. The second gate layer 152 can be referred to as a second gate electrode. The first gate layer 151 and the second gate layer 152 may independently include polysilicon, metal, metal silicide, metal nitride, another suitable material, or a combination thereof. Exemplified metal materials of the first gate layer 151 and the second gate layer 152 include TiN, TaN, $ZrSi_2$, $MoSi_2$, $TaSi_2$, $NiSi_2$, WN, or another suitable metal material.

In addition, in some embodiments, the first gate layer 151 and the second gate layer 152 are formed of polysilicon or metal, such as polysilicon or metal doped with p-type dopant or n-type dopant. For example, the first gate layer 151 may include a single n-type metal material layer, or may include a combination of one n-type metal material layer and one or more p-type metal material layers. The second gate layer 152 may include a single n-type metal material layer, or may include a combination of one n-type metal material layer and one or more p-type metal material layers.

In addition, the first gate layer 151 of the first gate structure GS-1 and the second gate layer 152 of the second gate structure GS-2 may be formed by a deposition method, such as chemical vapor deposition (CVD), physical vapor deposition (PVD), sputtering, plating, or another suitable method.

Figure 5:
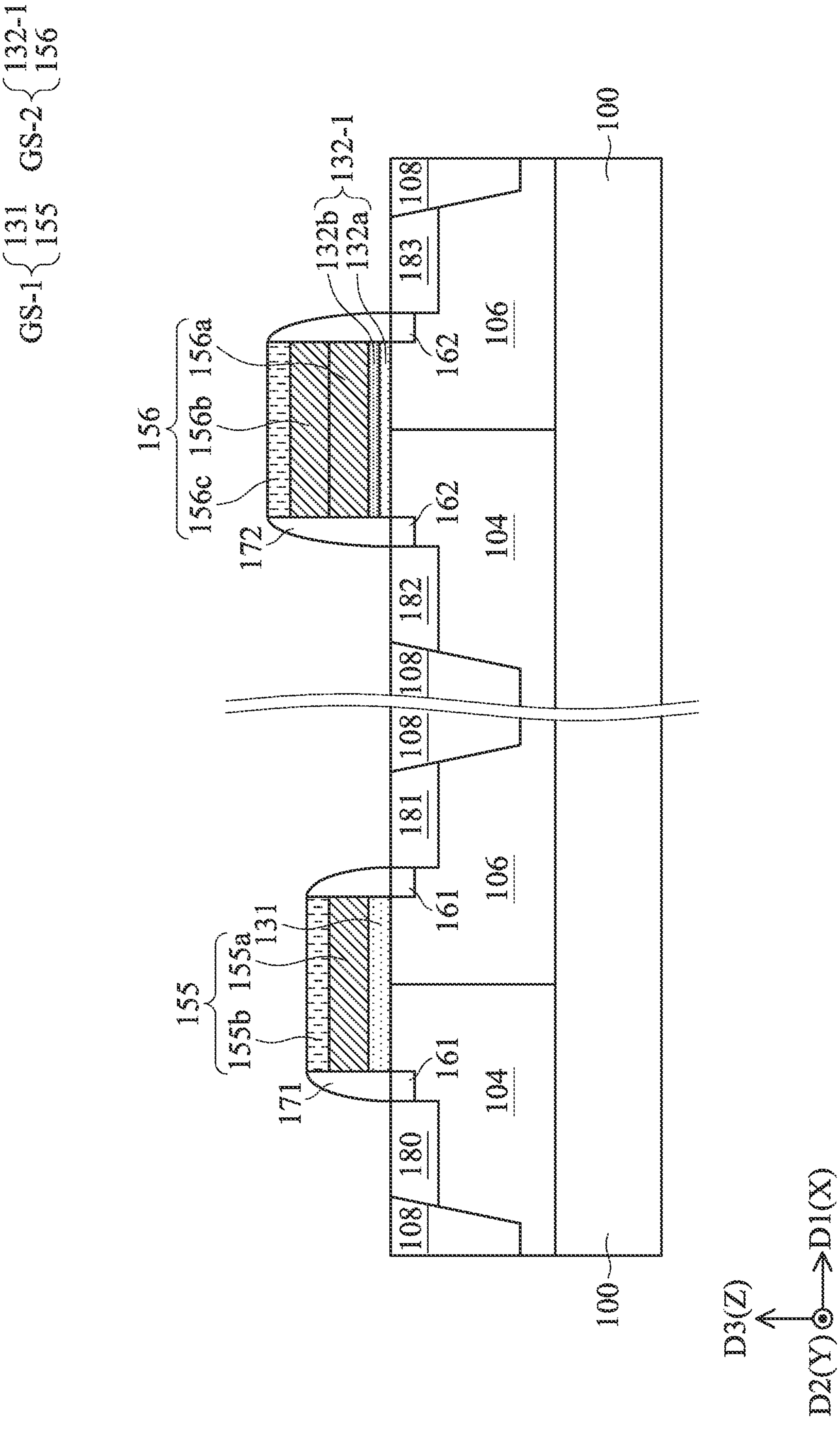
FIG. 5 is a cross-sectional view of an intermediate stage of a semiconductor device structure, in accordance with some embodiments of the present disclosure.

In some embodiments, the first gate layer 151 of the first gate structure GS-1 may be a single layer or a multi-layered structure. Similarly, the second gate layer 152 of the second gate structure GS-2 may be a single layer or a multi-layered structure. In this example, as shown in FIG. 2A-FIG. 2D, the first gate layer 151 is depicted as a single conductive material layer, and the second gate layer 152 is also depicted as a single conductive material layer for clear illustrations of this embodiment. However, the present disclosure is not limited to the configurations of the first gate layer 151 and the second gate layer 152 in FIG. 2A-FIG. 2D. In some other embodiments, the first gate layer 151 is a single conductive material layer, and the second gate layer 152 includes several conductive material layers (e.g. the second gate layer 154 includes two conductive material layers **154*a* and 154*b*, as shown in FIG. 5, and will be described later). In some other embodiments, the first gate layer 151 and the second gate layer 152** each includes multiple conductive material layers.

In addition, in some embodiments, the first gate layer 151 and the second gate layer 152 have a different number of conductive material layers (e.g. metal material layers). In some other embodiments, the first gate layer 151 and the second gate layer 152 include the same number of conductive material layers. The number of conductive material layers in the first gate layer 151 and the second gate layer 152 are not limited in the present disclosure. In FIG. 2A-FIG. 2D, each of the first gate layer 151 and the second gate layer 152 is illustrated as a single conductive material layer for clear illustrations of this embodiment.

In some embodiments, the first gate structure GS-1 of the first device 10-1 further includes a first hard mask (not shown) formed over the first gate layer 151, and the second gate structure GS-2 of the second device 10-2 further includes a second hard mask (not shown) formed over the second gate layer 152. The first hard mask and the second hard mask may be formed by a deposition process or another suitable process. The first hard mask and the second hard mask may include silicon nitride, silicon oxynitride, silicon carbide, another suitable material, or a combination thereof. To simplify the diagram, one gate dielectric layer and one gate layer are depicted herein for illustrating each of the first gate structure GS-1 and the second gate structure GS-2.

In addition, the first gate structure GS-1 of the first device 10-1 may be asymmetrically disposed on the P-well region 104 and the N-well region 106 of the first device 10-1. For instance, the first gate structure GS-1 may have a first overlapping length with the P-well region 104 and a second overlapping length with the N-well region 106, respectively. The first overlapping length can be defined from the P-N junction of the P-well region 104 and the N-well region 106 to the sidewall of the first gate dielectric layer 131 that is on the P-well region 104. The second overlapping length can be defined from the P-N junction of the P-well region 104 and the N-well region 106 to the opposite sidewall of the first gate dielectric layer 131 that is on the N-well region 106. According to the configuration of the first gate structure GS-1, the P-well region 104 and the N-well region 106, the first overlapping length is greater than the second overlapping length. However, the present disclosure is not limited thereto, and the first overlapping length can be equal to or less than the second overlapping length. In some embodiments, the second gate structure GS-2 may be asymmetrically or symmetrically disposed on the P-well region 104 and the N-well region 106 of the second device 10-2. Configuration of the second gate structure GS-2, the P-well region 104 and the N-well region 106 under the second gate structure GS-2, the first overlapping length and the second overlapping length between the second gate structure GS-2 and the P-N junction are similar to those contents for the previously described first gate structure GS-1, and the details will not be repeated herein.

Figure 2B:
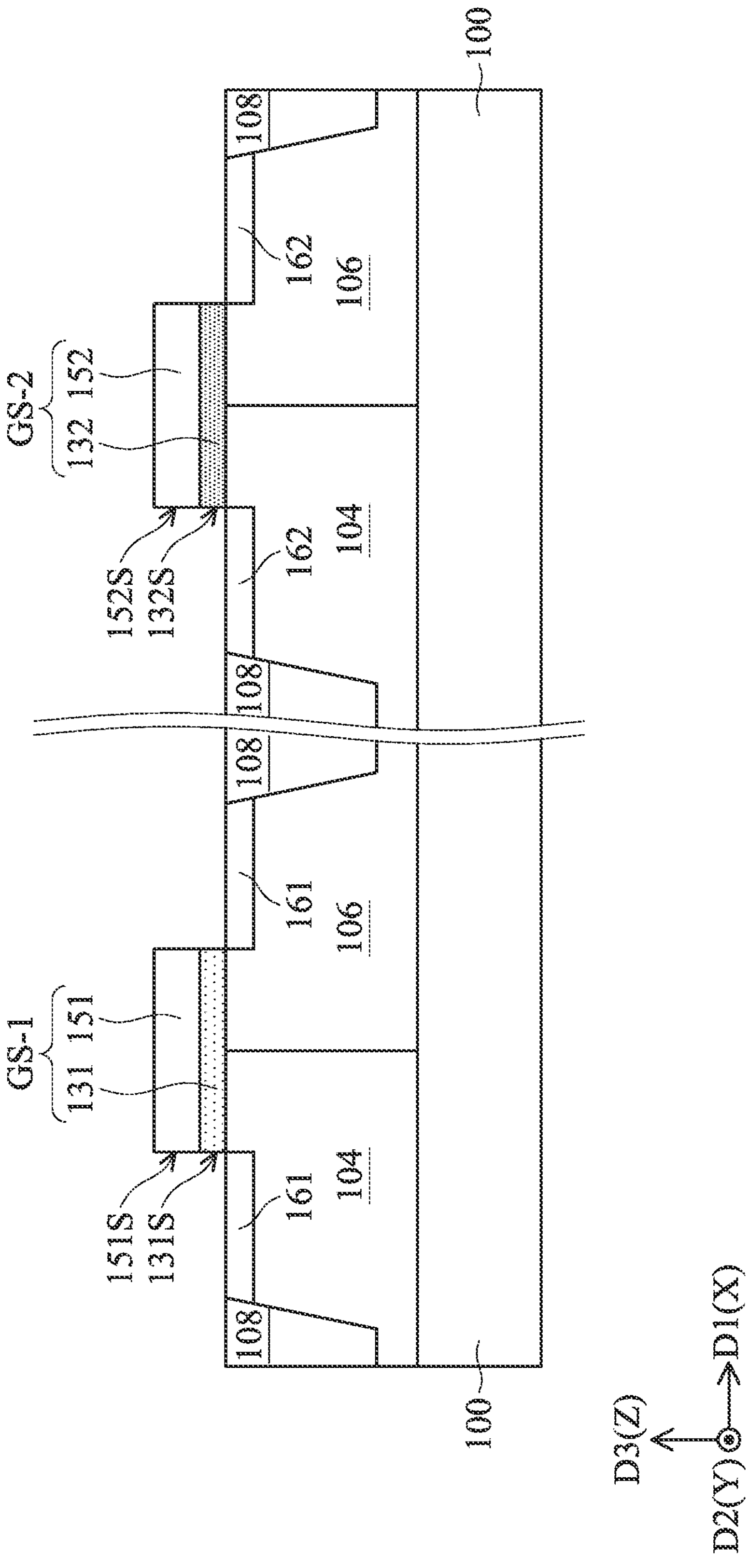
Figure 3:
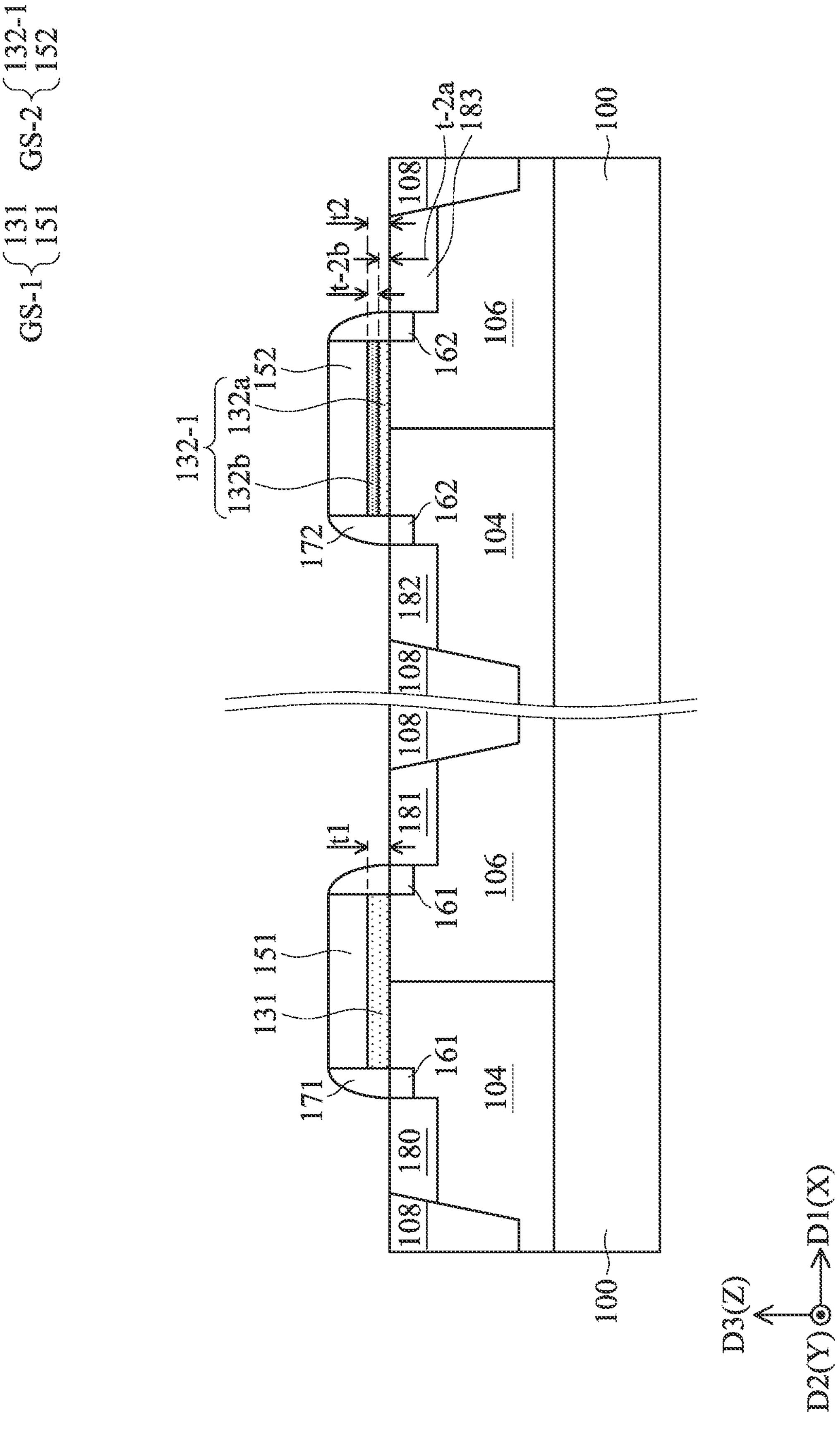
FIG. 3 is a cross-sectional view of an intermediate stage of a semiconductor device structure, in accordance with some embodiments of the present disclosure.

Referring to FIG. 2B, in some embodiments, lightly doped regions (LDD) 160 are further formed in the semiconductor substrate 100. The lightly doped regions 160 include the first lightly doped regions 161 formed in the first region 10A of the semiconductor substrate 100, and the second lightly doped regions 162 formed in the second region 10B of the semiconductor substrate 100. The first lightly doped regions 161 are adjacent to the sidewalls of the first gate structure GS-1. Specifically, in this example, the first lightly doped regions 161 are substantially aligned with the sidewalls 131S of the first gate dielectric layer 131 and the sidewalls 151S of the first gate layer 151. The second lightly doped regions 162 are adjacent to the sidewalls of the second gate structure GS-2. Specifically, in this example, the second lightly doped regions 162 are substantially aligned with the sidewalls 132S of the second gate dielectric layer 132 and the sidewalls 152S of the second gate layer 152. In some embodiments, the first lightly doped regions 161 can be formed by using the first gate structure GS-1 as an implant mask, and the second lightly doped regions 162 can be formed by using the second gate structure GS-2 as an implant mask. Accordingly, the first lightly doped regions 161 and the second lightly doped regions 162 may be formed without requiring an extra photomask for patterning and/or implantation process. Thus, the first lightly doped regions 161 may have an edge substantially self-aligned to an edge of the first gate structure GS-1, and the second lightly doped regions 162 may have an edge substantially self-aligned to an edge of the second gate structure GS-2.

Figure 2C:
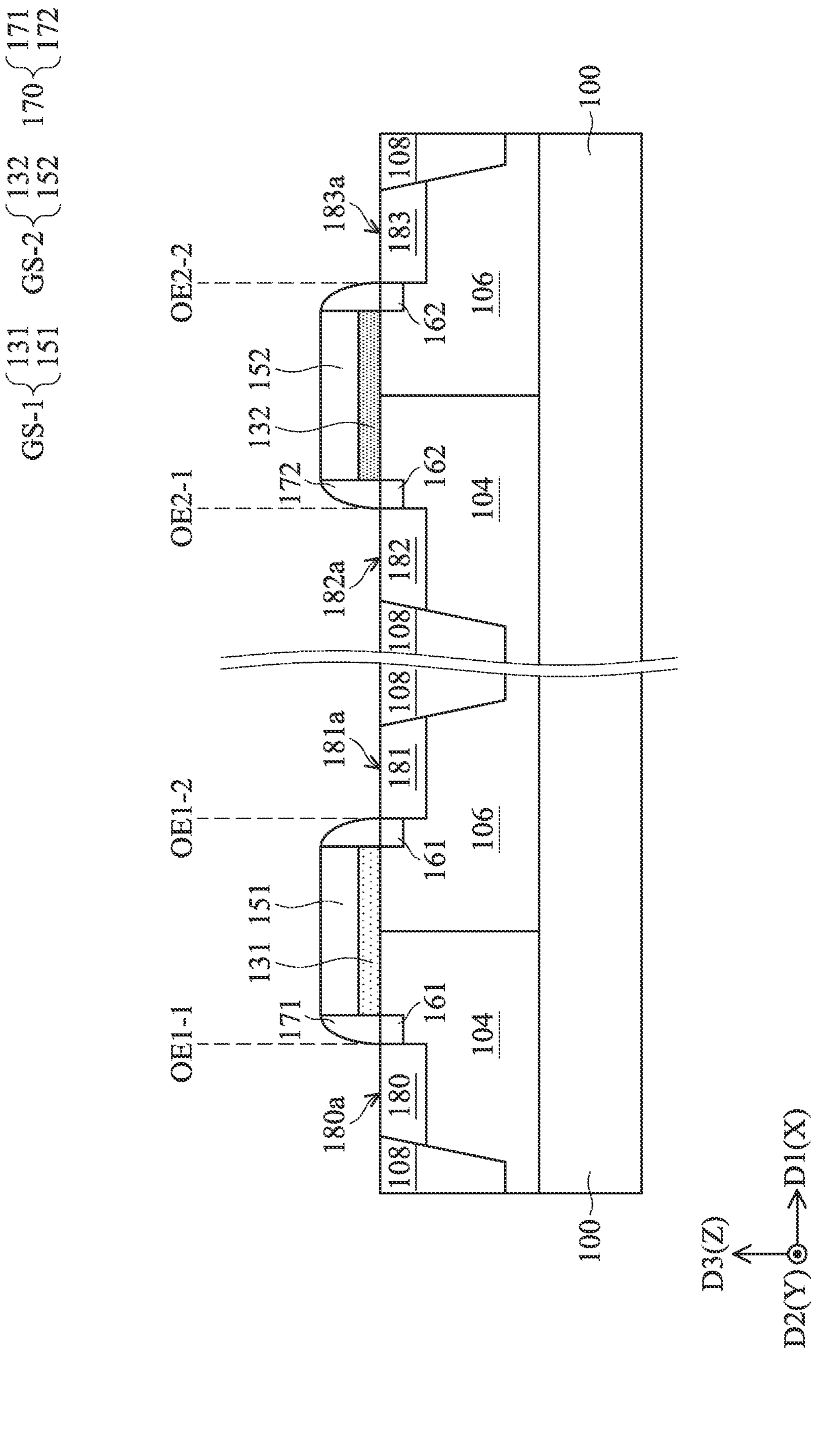

Next, referring to FIG. 2C, the gate spacers 170 are formed on the sidewalls of the gate structures, followed by forming the source regions and the drain regions adjacent to the gate spacers 170.

In some embodiments, the gate spacers 170 include the first gate spacers 171 formed on the sidewalls of the first gate structure GS-1 and the second gate spacers 172 formed on the sidewalls of the second gate structure GS-2. The first gate spacers 171 are formed on the first lightly doped regions 161. Specifically, in this example, the first gate spacers 171 are formed on the sidewalls 131S of the first gate dielectric layer 131 and the sidewalls 151S of the first gate layer 151. The second gate spacers 172 are formed on the second lightly doped regions 162. Specifically, in this example, the second gate spacers 172 are formed on the sidewalls 132S of the second gate dielectric layer 132 and the sidewalls 152S of the second gate layer 152.

In some embodiments, the first gate spacers 171 of the first device 10-1 and the second gate spacers 172 of the second device 10-2 each includes a dielectric material such as silicon oxide. In some other embodiments, the first gate spacers 171 and the second gate spacers 172 may optionally include silicon nitride, silicon carbide, silicon oxynitride, or combinations thereof. In some embodiments, the first gate spacers 171 are made of a single spacer material layer or include a multi-layered structure of spacer materials. The second gate spacers 172 are made of a single spacer material layer or include a multi-layered structure of spacer materials.

In some embodiments, each of the first gate spacers 171 and the second gate spacers 172 includes four spacer material layers. For example, the first spacer material layer (not shown) is a silicon nitride layer with impurity of boron, carbon, fluorine, or combinations thereof. The precursor of a deposition process for forming the silicon nitride layer includes a silicon-containing gas, such as $SiH_2Cl_2$, $Si_2H_6$, $SiH_4$, $Si_2Cl_6$, or BTBAS, and a nitrogen-containing gas, such as $NH_3$, $N_2$, or $N_2O$. Also, the second spacer material layer, the third spacer material layer and the fourth spacer material layer (not shown), for example, are dielectric layers with low dielectric constant (low-k). The k values of the second spacer material layer, the third spacer material layer and the fourth spacer material layer may be in a range from about 4.2 to about 5.5. In some embodiments, the first spacer material layer, the second spacer material layer, the third spacer material layer and the fourth spacer material layer are low-k dielectric with impurities therein. The precursor of the deposition process of the low-k dielectric with impurities may include a boron-containing gas, such as $BCl_3$, $BH_3$, or $B_2H_6$, or a carbon-containing gas, such as $C_2H_4$ or $C_2H_6$. In some embodiments, the space materials include oxide, nitride, oxynitride with boron, carbon, fluorine, or combinations thereof. In some embodiments, the space materials include silicon carbide with boron, nitrogen, fluorine, or combinations thereof.

In some embodiments, the first gate spacers 171 of the first device 10-1 and the second gate spacers 172 of the second device 10-2 can be formed in the same deposition and etching process. In one example, an initial spacer material layer can be conformally deposited over the semiconductor substrate 100, and the initial spacer material layer covers the first gate structure GS-1 and the second gate structure GS-2. Then, the initial spacer material layer is patterned to form the first gate spacers 171 and the second gate spacers 172, as shown in FIG. 2C. The patterning step may be performed by a wet etching process, a dry etching process, or combinations thereof. In some embodiments, the initial spacer material layer is patterned by a dry etching process. In some embodiments, the initial spacer material layer is patterned by an anisotropic dry etching process.

In some embodiments, after the first gate spacers 171 and the second gate spacers 172 are formed, the heavily doped regions that include the source regions and the drain regions are formed in the semiconductor substrate 100 and positioned adjacent to the gate spacers. In this example, the first source region 180 and the first drain region 181 are formed in the semiconductor substrate 100 and positioned adjacent to the first gate spacers 171 of the first device 10-1. The second source region 182 and the second drain region 183 are formed in the semiconductor substrate 100 and positioned adjacent to the second gate spacers 172 of the second device 10-2.

In some embodiments, the first source region 180 and the first drain region 181 are formed by using the first gate structure GS-1 and the first gate spacers 171 as an implant mask. The second source region 182 and the second drain region 183 are formed by using the second gate structure GS-2 and the second gate spacers 172 as an implant mask. Therefore, no extra mask is required for forming the first source region 180, the first drain region 181, the second source region 182 and the second drain region 183, in accordance with some embodiments of the present disclosure.

In this exemplified embodiment, the first source region 180 and the first drain region 181 can be self-aligned with the outer edges of the first gate spacers 171 of the first gate structure GS-1. The second source region 181 and the second drain region 182 can be self-aligned with the outer edges of the second gate spacers 172 of the second gate structure GS-2. Specifically, as shown in FIG. 2C, the inner edge of the first source region 180 is aligned with the outer edge OE1-1 of the left portion of the first gate spacers 171, and the inner edge of the first drain region 181 is aligned with the outer edge OE1-2 of the right portion of the first gate spacers 171. The inner edge of the second source region 182 is aligned with the outer edge OE2-1 of the left portion of the second gate spacers 172, and the inner edge of the second drain region 183 is aligned with the outer edge OE2-2 of the right portion of the second gate spacers 172.

In addition, no spacer material covers the top surface 180*a* of the first source region 180 and the top surface 181*a* of the first drain region 181, in accordance with some embodiments of the present disclosure. Therefore, the entire top surface 180*a* of the first source region 180 and the top surface 181*a* of the first drain region 181 provide large areas for forming silicide regions (not shown) on the first source region 180 and the first drain region 181 in the subsequent process. Also, no spacer material covers the top surface 182*a* of the second source region 182 and the top surface 183*a* of the second drain region 183, in accordance with some embodiments of the present disclosure. Therefore, the entire top surface 182*a* of the second source region 182 and the top surface 183*a* of the second drain region 183 provide large areas for forming silicide regions (not shown) on the second source region 182 and the second drain region 183 in the subsequent process.

In addition, in some embodiments, after the first source region 180 and the first drain region 181 are formed, a left portion of the first lightly doped region 161 is positioned between the first source region 180 and the first gate structure GS-1, and a right portion of the first lightly doped region 161 is positioned between the first drain region 181 and the first gate structure GS-1. After the second source region 182 and the second drain region 183 are formed, a left portion of the second lightly doped region 162 is positioned between the second source region 182 and the second gate structure GS-2, and a right portion of the second lightly doped region 162 is positioned between the second drain region 183 and the second gate structure GS-2.

As shown in FIG. 2C, in some embodiments, the left portion of the first lightly doped region 161 is positioned beneath the left portion of the first gate spacer 171, and is adjacent to the left sidewall of the first gate structure GS-1. The right portion of the first lightly doped region 161 is positioned beneath the right portion of the first gate spacer 171, and is adjacent to the right sidewall of the first gate structure GS-1. In some embodiments, the left portion of the second lightly doped region 162 is positioned beneath the left portion of the second gate spacer 172, and is adjacent to the left sidewall of the second gate structure GS-2. The right portion of the second lightly doped region 162 is positioned beneath the right portion of the second gate spacer 172, and is adjacent to the right sidewall of the second gate structure GS-2.

Also, because the first source region 180 and the first drain region 181 are formed by using the first gate structure GS-1 and the first gate spacers 171 as an implant mask, the outer edges of the first lightly doped regions 161 that contact the first source region 180 and the first drain region 181 are aligned respectively with the outer edges of the opposite portions of the first gate spacers 171 after the first source region 180 and the first drain region 181 are formed. For example, the outer edge of the left portion of the first lightly doped region 161 is aligned with the outer edge OE1-1 of the left portion of the first gate spacers 171, and the outer edge of the right portion of the first lightly doped region 161 is aligned with the outer edge OE1-2 of the right portion of the first gate spacers 171.

Similarly, because the second source region 182 and the second drain region 183 are formed by using the second gate structure GS-2 and the second gate spacers 172 as an implant mask, the outer edges of the second lightly doped regions 162 that contact the second source region 182 and the second drain region 183 are aligned respectively with the outer edges of the opposite portions of the second gate spacers 172 after the second source region 182 and the second drain region 183 are formed. For example, the outer edge of the left portion of the second lightly doped region 162 is aligned with the outer edge OE2-1 of the left portion of the second gate spacers 172, and the outer edge of the right portion of the second lightly doped region 162 is aligned with the outer edge OE2-2 of the right portion of the second gate spacers 172.

Figure 2D:
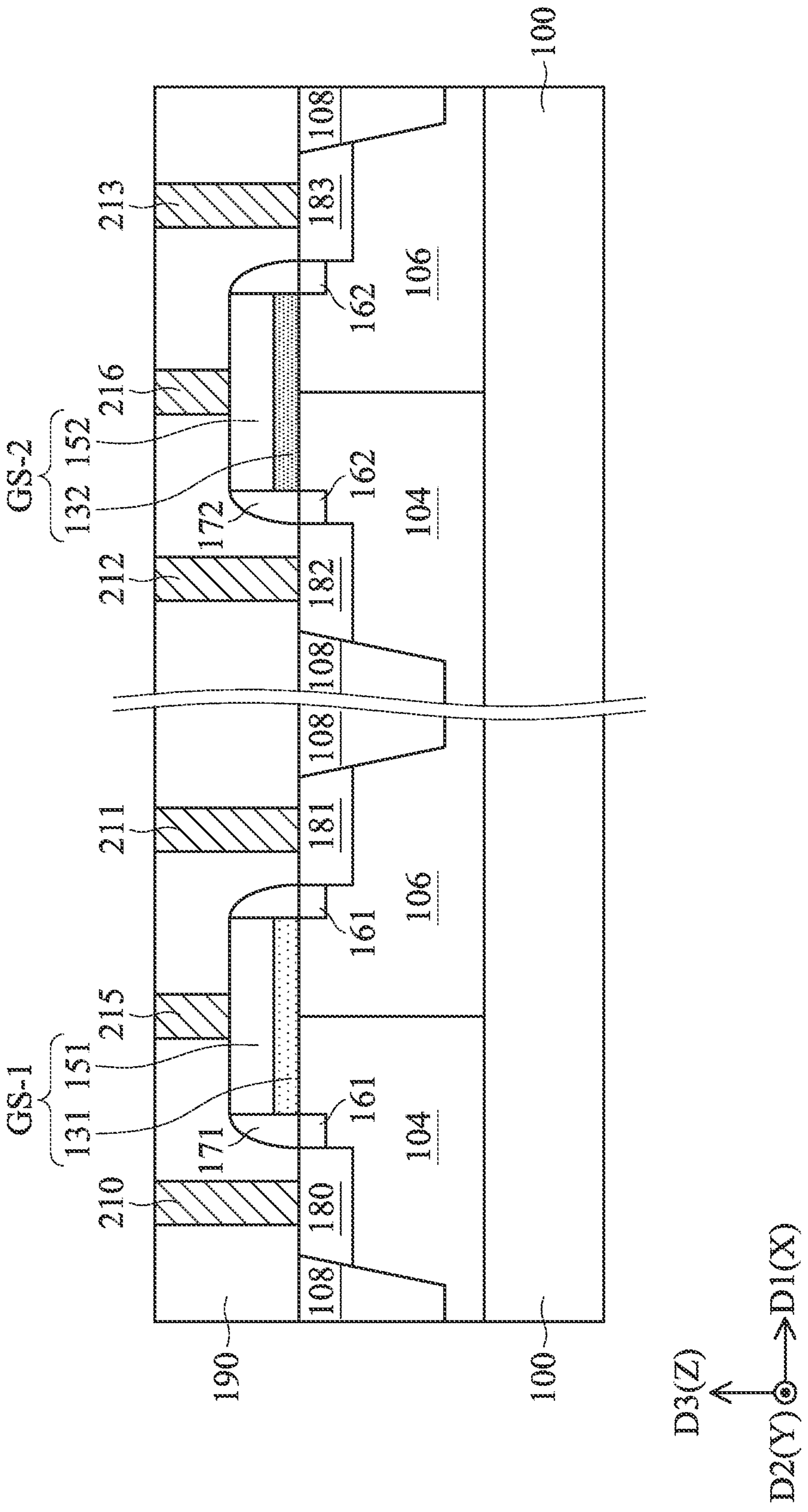

Referring to FIG. 2D, in some embodiments, an inter-layer dielectric (ILD) layer 190 is formed over the semiconductor substrate 100. Then, the contact plugs are formed by filling contact openings (not shown) in the inter-layer dielectric layer 190 with conductive materials. As shown in FIG. 2D, the first contact plugs 210, 211 and 215 contact the first source region 180, the first drain region 181 and the first gate structure GS-1, respectively. The second contact plugs 212, 213 and 216 contact the second source region 182, the second drain region 183 and the second gate structure GS-2, respectively. Specifically, the first contact plugs 215 and 216 contact the first gate layer 151 of the first gate structure GS-1 and the second gate layer 152 of the second gate structure GS-2, respectively.

In some embodiments, before the inter-layer dielectric layer 190 is deposited, silicide regions (not shown) can be further formed on the first source region 180, the first drain region 181, the first gate layer 151 of the first gate structure GS-1, the second source region 182, the second drain region 183 and the second gate layer 152 of the second gate structure GS-2 to reduce gate contact resistance and source/drain contact resistance. In some embodiments, the silicide regions can be formed by blanket depositing a metal layer (not shown) on the previously formed structure shown in FIG. 2C, and an annealing process is performed. When annealed, the metal layer reacts with the underlying silicon and silicide regions are formed on the first source region 180, the first drain region 181, the first gate layer 151 of the first gate structure GS-1, the second source region 182, the second drain region 183 and the second gate layer 152 of the second gate structure GS-2. The un-reacted metal layer is then removed after the annealing process.

In addition, in some embodiments, after the silicide regions are formed, a contact etch stop layer (not shown) is further formed by a blanket deposition to cover the entire structure in FIG. 2C. The contact etch stop layer can act as an etch stop layer during formation of contact openings, thereby protecting underlying regions from being over etched. Also, the contact etch stop layer provides a stress, preferably a tensile stress for an NMOS transistor, to the semiconductor device and enhances carrier mobility. Next, the inter-layer dielectric layer 190 is deposited on the contact etch stop layer. Then, the contact openings are made through the inter-layer dielectric layer 190 and those contact openings are filled with a conductive material layer. A planarization process, such as chemical mechanical planarization, another suitable planarization method or a combination thereof, is then performed to planarize the conductive material layer and the inter-layer dielectric material, thereby forming the contact plugs 210, 211, 212, 213, 215 and 216 in the inter-layer dielectric layer 190 with planarized top surfaces, as shown in FIG. 2D. In some embodiments, the contact plugs 210, 211 and 215 contact the silicide regions (not shown) on the first source region 180, the first drain region 181 and the first gate layer 151 of the first gate structure GS-1, respectively. In some embodiments, the contact plugs 212, 213 and 216 contact the silicide regions (not shown) on the second source region 182, the second drain region 183 and the second gate layer 152 of the second gate structure GS-2, respectively.

Figure 8:
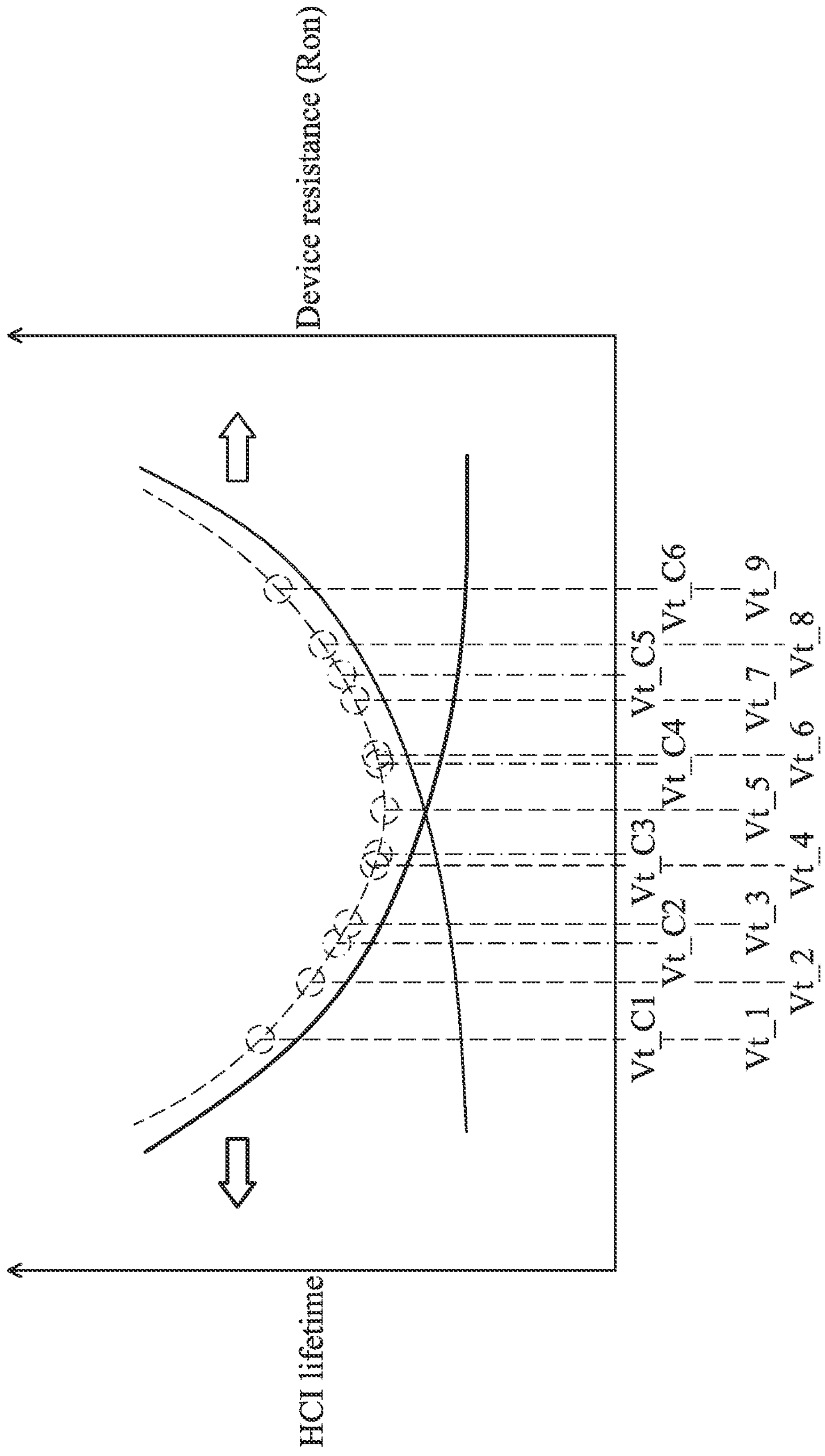
FIG. 8 shows a trade-off between hot carrier injection (HCI) lifetime and device resistance of a high-voltage (HV) semiconductor device.

In the conventional semiconductor device, extending distance between drain and gate or STI insertion between drain and gate is implemented for preventing the hot carrier injection (HCI) effect. However, those conventional modifications also increase the device resistance (such as on-resistance; Ron) of the semiconductor device. Generally, the hot carrier injection (HCI) lifetime decreases as the threshold voltage (Vt) of the semiconductor device increases (as shown in FIG. 8). However, the device resistance (such as on-resistance; Ron) increases as the threshold voltage (Vt) of the semiconductor device increases (as shown in FIG. 8). Therefore, it is important for a semiconductor device with a suitable threshold voltage (Vt) that not only meet the design requirement but also hit the sweet spot of the hot carrier injection (HCI) lifetime and the device resistance.

According to some embodiments, a semiconductor device structure includes two or more devices on the semiconductor substrate, and the gate dielectric layers of the devices that are made of different dielectric material compositions have its own dielectric constants. By forming the gate dielectric layers having different dielectric material compositions and its own dielectric constants, the high-voltage (HV) devices that are fabricated on the same semiconductor substrate 100, in accordance with some embodiments of the present disclosure, could have specific threshold voltages (Vt) that not only meet the design requirement (i.e. have good electrical characteristics) but also hit the sweet spot of the hot carrier injection (HCI) lifetime and the device resistance.

Also, the configurations of the gate dielectric layers of the gate structures of different devices in the aforementioned embodiment, such as each of the first gate dielectric layer 131 of the first gate structure GS-1 and the second gate dielectric layer 132 of the second gate structure GS-2 being a single dielectric material layer in FIG. 2A-FIG. 2D, are merely provided for illustration of some applicable types. The present disclosure is not limited to the structural configurations of the gate dielectric layers in the previously described embodiments. According to the present disclosure, one or more devices may have a gate dielectric layer including several dielectric material layers.

FIG. 3 is a cross-sectional view of an intermediate stage of a semiconductor device structure, in accordance with some embodiments of the present disclosure. The intermediate structure in FIG. 3 is identical to the intermediate structure in FIG. 2C except for the configuration of the second gate dielectric layer 132-1. The same or similar features of the structures in FIG. 2C and FIG. 3 are numbered in the same or similar ways for the sake of simplicity and clarity.

The configurations of those same or similar features in FIG. 2C and FIG. 3 have been described in the previously described embodiments, and the details will not be repeated herein. Also, the method for forming the structure in FIG. 3 that includes P-well regions 104, N-well regions 106 and the isolation regions 108 in the semiconductor substrate 100, the first gate structure GS-1, the first lightly doped regions 161, the first gate spacers 171, the first source region 180 and the first drain region 181 of the first device 10-1, the second gate structure GS-2, the second lightly doped regions 162, the second gate spacers 172, the second source region 182 and the second drain region 183 of the second device 10-2 are similar to those contents in the previously described embodiment, and the process details will not be repeated herein.

Referring to FIG. 3, in some embodiments, the first gate dielectric layer 131 is a single dielectric material layer, and the second gate dielectric layer 132 includes two dielectric material layers. The dielectric material layers **132*a* and 132*b* collectively form a second gate dielectric layer 132-1 of the second gate structure GS-2. The first gate dielectric layer 131 and the dielectric material layer 132*a* may include the same dielectric material, and can be formed on the semiconductor substrate 100 in the same deposition process. The dielectric material layers 132*a* and 132*b* may include different dielectric materials. The dielectric material layer 132*b*** is formed on the dielectric material layer 132*a* after the first gate dielectric layer 131 and the dielectric material layer 132*a* are formed on the semiconductor substrate 100. Accordingly, the first gate dielectric layer 131 and the second gate dielectric layer 132-1 have different dielectric material compositions.

In some embodiments, the first gate dielectric layer 131 of the first gate structure GS-1 has a first thickness t1 and the second gate dielectric layer 132-1 of the second gate structure GS-2 has a second thickness t2. In some embodiments, the first thickness t1 is equal to the second thickness t2. In some other embodiments, the first thickness t1 is different from the second thickness t2. In this exemplified example, the dielectric material layers 132*a* and 132*b* have the thickness t-2*a* and the thickness t-2*b*, respectively. In some embodiments, the first thickness t1 of the first gate dielectric layer 131 is equal to the thickness t-2*a* of the dielectric material layers 132*a* of the second gate dielectric layer 132-1. In some other embodiments, the first thickness t1 of the first gate dielectric layer 131 is different from the thickness t-2*a* of the dielectric material layers 132*a* of the second gate dielectric layer 132-1.

In addition, in some embodiments, the first thickness t1 of the first gate dielectric layer 131 may be in a range from about 1 angstrom to about 50 angstrom. The second thickness t2 of the second gate dielectric layer 132-1 may be in a range from about 1 angstrom to about 50 angstrom. It should be noted that those numerical values of the first gate dielectric layer 131 and the second gate dielectric layer 132-1 are provided for exemplification, and the present disclosure is not limited thereto. Any suitable numerical values of the first thickness t1 of the first gate dielectric layer 131 and the second thickness t2 of the second gate dielectric layer 132-1 may be applicable, depending on the design requirements.

According to the devices exemplified in the semiconductor device structure of FIG. 3, the gate dielectric layers of the high-voltage (HV) devices that are made of different dielectric material compositions have different dielectric constants. In some embodiments, the first gate dielectric layer 131 of the first gate structure GS-1 and the second gate dielectric layer 132-1 of the second gate structure GS-2 are high-k dielectric layers. The dielectric constant of the first gate dielectric layer 131 may be equal to or greater than 20. The dielectric constant of the second gate dielectric layer 132-1 may be equal to or greater than 20. In one example, the dielectric constant of the second gate dielectric layer 132-1 is greater than the dielectric constant of the first gate dielectric layer 131. According to the embodiments, different threshold voltages (Vt) of the high-voltage (HV) devices that are fabricated on the same semiconductor substrate 100 can be achieved by adjusting the material composition and the dielectric constant of each of the first gate dielectric layer 131 and the second gate dielectric layer 132-1. In addition, by forming the gate dielectric layers having different dielectric material compositions and its own dielectric constants, the high-voltage (HV) devices that are fabricated on the same semiconductor substrate 100, in accordance with some embodiments of the present disclosure, could have specific threshold voltages (Vt) that not only meet the design requirement (i.e. have good electrical characteristics) but also hit the sweet spot of the hot carrier injection (HCI) lifetime and the device resistance.

The configurations of the gate structures of different devices in the aforementioned embodiments, such as each of the first gate layer 151 of the first gate structure GS-1 and the second gate layer 152 of the second gate structure GS-2 being a single dielectric material layer in FIG. 2A-FIG. 2D and FIG. 3, are merely provided for illustration of some applicable types. The present disclosure is not limited to the structural configurations of the gate metal layers in the previously described embodiments. According to the present disclosure, one more devices may have a gate layer including several conductive material layers (e.g. metal material layers), depending on the design requirements.

Figure 4:
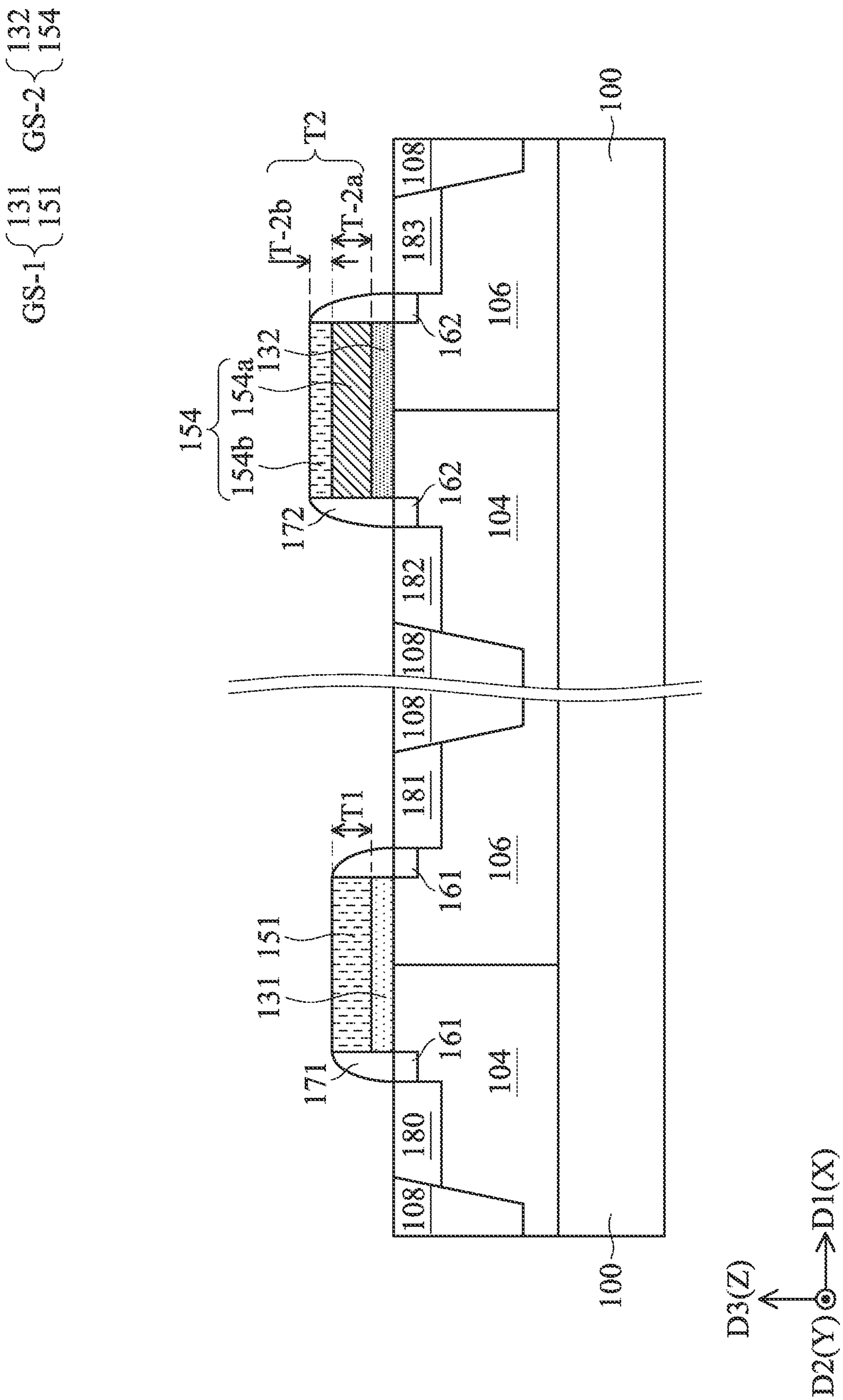
FIG. 4 is a cross-sectional view of an intermediate stage of a semiconductor device structure, in accordance with some embodiments of the present disclosure.

FIG. 4 is a cross-sectional view of an intermediate stage of a semiconductor device structure, in accordance with some embodiments of the present disclosure. The major difference between the intermediate structures in FIG. 4 and FIG. 2A-FIG. 2D is the number of conductive material layers in the second gate layers 153 and 154. The second gate layer 153 in FIG. 2A-FIG. 2D includes one conductive material layer and the second gate layer 154 in FIG. 4 includes two conductive material layers. The same or similar features of the structures in FIG. 2A-FIG. 2D and FIG. 4 are numbered the same or similarly for the sake of simplicity and clarity. In addition, the structures and methods of forming those same or similar features in FIG. 2A-FIG. 2D and FIG. 4 have been described in the previously described embodiments, and the details will not be repeated herein.

Referring to FIG. 4, in some embodiments, the first gate layer 153 is a single conductive material layer, and the second gate layer 154 includes two conductive material layers. The conductive material layers 154*a* and 154*b* collectively form the second gate layer 154 of the second gate structure GS-2. The conductive material layers 154*a* and 154*b* may include different conductive materials. In some embodiments, the conductive material layer 154*a* includes one or more p-type metal materials, and the conductive material layer 154*b* includes one or more n-type metal materials. In addition, the first gate layer 153 and the conductive material layer 154*b* of the second gate layer 154 may include the same conductive material, and can be formed in the same deposition process. In some embodiments, the first gate layer 153 and the conductive material layer 154*b* are formed after the conductive material layer 154*a* is formed on the second gate dielectric layer 132. In addition, the first gate dielectric layer 131 below the first gate layer 153 and the second gate dielectric layer 132-1 below the second gate layer 154 have different dielectric material compositions.

In some embodiments, the first gate layer 153 of the first gate structure GS-1 has a first gate thickness T1, and the second gate layer 154 of the second gate structure GS-2 has a second gate thickness T2. In some embodiments, the first gate thickness T1 is different from the second gate thickness T2. In this exemplified example, the conductive material layers 154*a* and 154*b* have the gate thickness T-2*a* and the gate thickness T-2*b*, respectively. The gate thickness T-2*a* may be equal to or different from the gate thickness T-2*b*. The first gate thickness T1 of the first gate layer 153 may be equal to or different from the gate thickness T-2*b* of the conductive material layers 154*b* of the second gate layer 154.

In addition, in some embodiments, the first gate layer 153 is an n-type metal material layer, the conductive material layer 154*a* of the second gate layer 154 is a p-type metal material layer, and the conductive material layer 154*b* of the second gate layer 154 is an n-type metal material layer. In some embodiments, the thickness of the p-type metal material layer is in a range from about 1 angstrom to about 50 angstrom. In some embodiments, the thickness of the n-type metal material layer is in a range from about 1 angstrom to about 500 angstrom. It should be noted that those numerical values of the first gate layer 153 and the second gate layer 154 are provided for exemplification, and the present disclosure is not limited thereto. Any suitable numerical values of the gate thickness T1 of the first gate layer 153 and the gate thicknesses T-2*a* and T-2*b* of the second gate layer 154 may be applicable, depending on the design requirements.

According to the devices exemplified in the semiconductor device structure of FIG. 4, the gate dielectric layer of one high-voltage (HV) device includes a dielectric material composition different from that of the gate dielectric layer of the other high-voltage (HV) device. Also, the high-voltage (HV) devices have different gate heights. Accordingly, as exemplified in FIG. 4, the high-voltage (HV) devices that are fabricated on the same semiconductor substrate 100 have different specific threshold voltages (Vt). That is, the specific threshold voltages of the high-voltage (HV) devices can be fine-tuned in accordance with some embodiments. Therefore, those high-voltage (HV) devices with specific threshold voltages can meet the electrical characteristic requirements, and also hit the sweet spots of the hot carrier injection (HCI) lifetime and the device resistance (such as on-resistance).

FIG. 5 is a cross-sectional view of an intermediate stage of a semiconductor device structure, in accordance with some embodiments of the present disclosure. The difference between the intermediate structures in FIG. 5 and FIG. 2A-FIG. 2D is the configurations of the gate structures. In FIG. 5, the first gate dielectric layer 131 is a single dielectric material layer, and the second gate dielectric layer 132-1 includes two dielectric material layers 132*a* and 132*b*. Materials and configurations of the first gate dielectric layer 131 and the second gate dielectric layer 132-1 have been provided in the previously described embodiments, and the details will not be repeated herein.

In addition, in this exemplified embodiment, the first gate layer 155 includes two conductive material layers 155*a* and 155*b*, and the second gate layer 156 includes three conductive material layers 156*a*, 156*b* and 156*c*, as shown in FIG. 5. The same or similar features of the structures in FIG. 2A-FIG. 2D, FIG. 3 and FIG. 5 are numbered the same or similarly for the sake of simplicity and clarity. In addition, the structures and methods of forming those same or similar features in FIG. 2A-FIG. 2D, FIG. 3 and FIG. 5 have been described in the previously described embodiments, and the details will not be repeated herein.

In some embodiments, the conductive material layers 155*a* of the first gate layer 155 is a p-type metal material layer, and the conductive material layers 155*b* of the first gate layer 155 is an n-type metal material layer. In some embodiments, the conductive material layers 156*a* and 156*b* of the second gate layer 156 are p-type metal material layers, and the conductive material layer 156*c* of the second gate layer 156 is an n-type metal material layer. In some embodiments, the thickness of the p-type metal material layer is in a range from about 1 angstrom to about 50 angstrom. In some embodiments, the thickness of the n-type metal material layer is in a range from about 1 angstrom to about 500 angstrom. It should be noted that those numerical values of the first gate layer 155 and the second gate layer 156 are provided for exemplification, and the present disclosure is not limited thereto. Any suitable numerical values of the gate thicknesses of the first gate layer 155 and the second gate layer 156 are applicable, depending on the design requirements.

According to the devices exemplified in the semiconductor device structure of FIG. 5, the gate dielectric layer of one high-voltage (HV) device includes a dielectric material composition different from that of the gate dielectric layer of the other high-voltage (HV) device. Also, the high-voltage (HV) devices have different gate heights. Accordingly, as exemplified in FIG. 5, the high-voltage (HV) devices that are fabricated on the same semiconductor substrate 100 have different specific threshold voltages (Vt). That is, the specific threshold voltages of the high-voltage (HV) devices can be fine-tuned in accordance with some embodiments. Therefore, those high-voltage (HV) devices with specific threshold voltages can meet the electrical characteristic requirement, and also the specific threshold voltages hit the sweet spot of the hot carrier injection (HCI) lifetime and the device resistance (such as on-resistance).

Although two high-voltage (HV) devices that are fabricated on the same semiconductor substrate 100 and have different threshold voltages are provided in the previously described embodiments, three or more devices having different threshold voltages can be fabricated on the semiconductor substrate 100, and those threshold voltages can be fine-tuned in accordance with some embodiments of the present disclosure.

Figure 6:
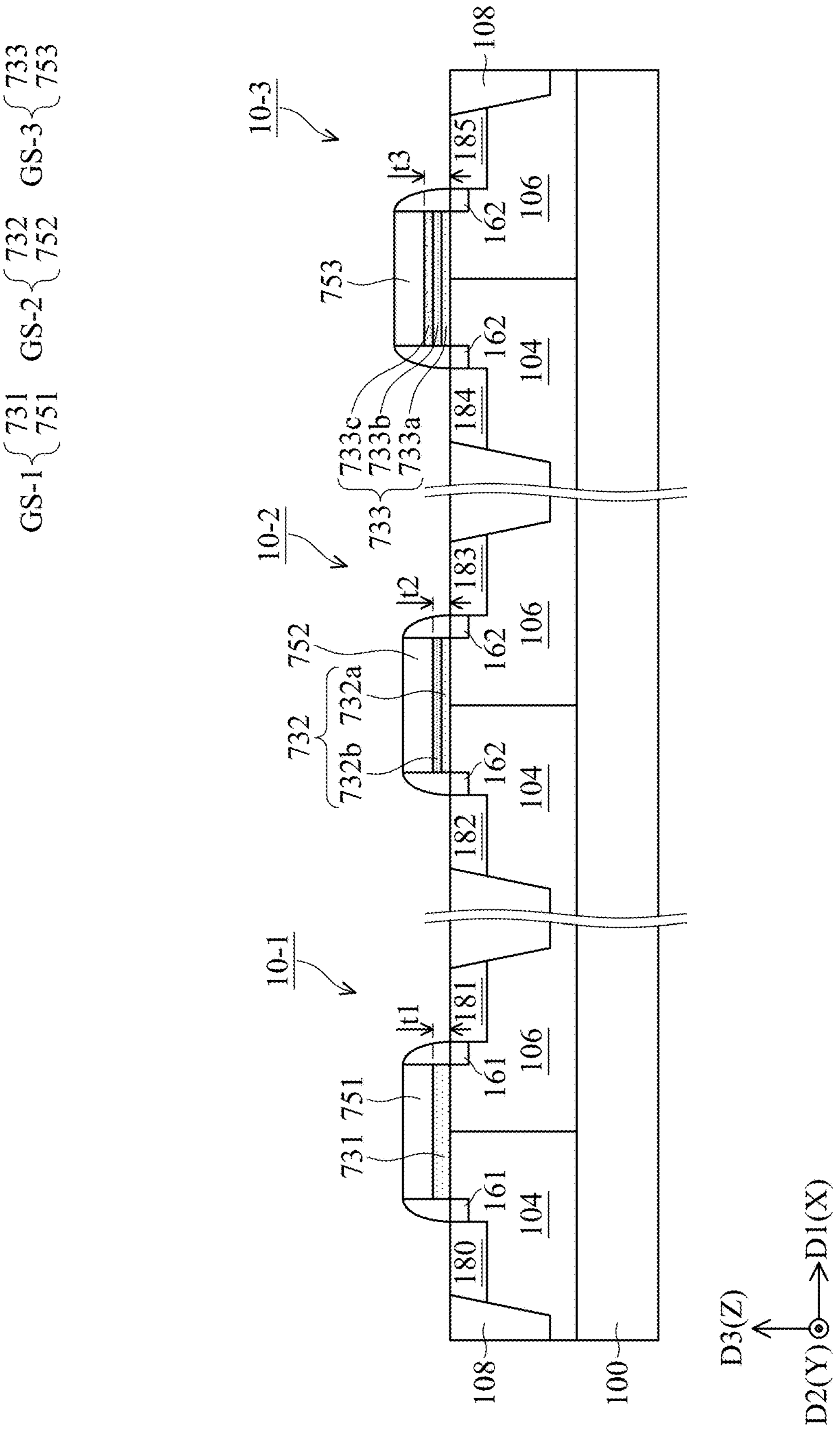
FIG. 6 is a cross-sectional view of an intermediate stage of a semiconductor device structure, in accordance with some embodiments of the present disclosure.

Three devices fabricated on the semiconductor substrate 100 is exemplified for illustration one of the embodiments. Please refer to FIG. 1 and FIG. 6. FIG. 6 is a cross-sectional view of an intermediate stage of a semiconductor device structure, in accordance with some embodiments of the present disclosure. The same or similar features of the structures in FIG. 2A-FIG. 2D, FIG. 3, FIG. 4, FIG. 5 and FIG. 6 are numbered in the same or similar ways for the sake of simplicity and clarity. In addition, the structures and methods of forming those same or similar features in FIG. 2A-FIG. 2D, FIG. 3, FIG. 4, FIG. 5 and FIG. 6 have been described in the previously described embodiments, and the details will not be repeated herein.

In this exemplified embodiment, the first device 10-1 (e.g. the first HVMOS transistor) is formed in the first region 10A, the second device 10-2 (e.g. the second HVMOS transistor) is formed in the second region 10B, and the third device 10-3 (e.g. the third HVMOS transistor) is formed in the third region 10C. In FIG. 6, the first device 10-1, the second device 10-2 and the third device 10-3 include the first gate structure GS-1, the second gate structure GS-2 and the third gate structure GS-3, respectively. In some embodiments, the third gate dielectric layer 733 of the third gate structure GS-3 and the first gate dielectric layer 731 of the first gate structure GS-1 have different dielectric material compositions. In some embodiments, the third gate dielectric layer 733 of the third gate structure GS-3 and the second gate dielectric layer 732 of the second gate structure GS-2 have different dielectric material compositions.

In this exemplified embodiments, the first gate structure GS-1 of the first device 10-1 includes a first gate dielectric layer 731 and a first gate layer 751 on the first gate dielectric layer 731. The second gate structure GS-2 of the second device 10-2 includes a second gate dielectric layer 732 and a second gate layer 752 on the second gate dielectric layer 732. The second gate dielectric layer 732 includes several dielectric material layers, such as two dielectric material layers 732*a* and 732*b*. The third gate structure GS-3 of the third device 10-3 includes a third gate dielectric layer 733 and a third gate layer 753 on the third gate dielectric layer 733. The third gate dielectric layer 733 also includes several dielectric material layers, such as three dielectric material layers 733*a*, 733*b* and 733*c*.

In addition, the first gate dielectric layer 731 of the first gate structure GS-1, the dielectric material layer 732*a* of the second gate structure GS-2 and the dielectric material layer 733*a* of the third gate structure GS-3 may include the same dielectric material, and can be formed on the semiconductor substrate 100 in the same deposition process. The dielectric material layers 732*a* and 732*b* of the second gate structure GS-2 may include different dielectric materials. The dielectric material layers 733*a* and 733*b* of the third gate structure GS-3 may include different dielectric materials. The dielectric material layers 733*b* and 733*c* of the third gate structure GS-3 may include the same dielectric material or different dielectric materials. In one example, the dielectric material layers 732*b* is formed on the dielectric material layer 732*a*, and the dielectric material layers 733*b* and 733*c* are formed on the dielectric material layer 733*a* after the first gate dielectric layer 731 and the dielectric material layer 732*a* are formed on the semiconductor substrate 100.

In some embodiments, the first gate dielectric layer 731 of the first gate structure GS-1, the second gate dielectric layer 732 of the second gate structure GS-2 and the third gate dielectric layer 733 of the third gate structure GS-3 are high-k dielectric layers. The first gate dielectric layer 731, the second gate dielectric layer 732, and the third gate dielectric layer 733 may each have a dielectric constant that is equal to or greater than 20.

In some embodiments, the dielectric constant of the second gate dielectric layer 732 is greater than the dielectric constant of the first gate dielectric layer 731, and the dielectric constant of the third gate dielectric layer 733 is greater than the dielectric constant of the second gate dielectric layer 732. In one example, the dielectric constant of the first gate dielectric layer 731 is in a range from about 20 to about 25, the dielectric constant of the second gate dielectric layer 732 is in a range from about 23 to about 28, and the dielectric constant of the third gate dielectric layer 733 is in a range from about 25 to about 30.

According to the embodiments, a wafer may include several high-voltage (HV) devices and the gate dielectric layers of the respective HV devices are made of different high-k dielectric materials, thereby achieving the required threshold voltages (Vt) of the devices. Examples of the materials of which the first gate dielectric layer 731, the second gate dielectric layer 732, and the third gate dielectric layer 733 are made of include hafnium oxide (HfOx), lanthanum oxide (LaOx), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. In one example, the first gate dielectric layer 731 and dielectric material layers 732*a* and 733*a* are made of hafnium oxide (HfOx), while dielectric material layers 732*b*, 733*b*, and 733*c* are made of lanthanum oxide (LaOx).

In addition, it should be noted that the present invention is not limited to the configurations of the gate structures in this embodiment. The first gate dielectric layer 731, the second gate dielectric layer 732 and the third gate dielectric layer 733 may contain the same or different number of dielectric material layers. The number of dielectric material layers in the first gate dielectric layer 731, the second gate dielectric layer 732, and the third gate dielectric layer 733 are not limited to this exemplified embodiment. Also, the first gate layer 751, the second gate layer 752 and the third gate layer 753 may each contain one conductive material layer (as shown in FIG. 6) or several conductive material layers. The first gate layer 751, the second gate layer 752 and the third gate layer 753 may contain the same or different number of conductive material layers. The number of conductive material layers in the first gate layer 751, the second gate layer 752, and the third gate layer 753 are not limited to this exemplified embodiment.

In some embodiments, the first gate dielectric layer 731 has a first thickness t1, the second gate dielectric layer 732 has a second thickness t2 and the third gate dielectric layer 733 has a third thickness t3. In this exemplified example, the first thickness t1, the second thickness t2 and the third thickness t3 are different from each other.

In addition, in some embodiments, the first thickness t1 of the first gate dielectric layer 731 may be in a range from about 1 angstrom to about 50 angstrom. The second thickness t2 of the second gate dielectric layer 732 may be in a range from about 1 angstrom to about 50 angstrom. The third thickness t3 of the third gate dielectric layer 733 may be in a range from about 1 angstrom to about 50 angstrom. It should be noted that those numerical values of the first gate dielectric layer 731, the second gate dielectric layer 732 and the third gate dielectric layer 733 are provided for exemplification, and the present disclosure is not limited thereto. Any suitable numerical values of the first thickness t1 of the first gate dielectric layer 731 and the second thickness t2 of the second gate dielectric layer 732 and the third thickness t3 of the third gate dielectric layer 733 may be applicable, depending on the design requirements.

According to the devices exemplified in the semiconductor device structure of FIG. 6, the gate dielectric layer of one high-voltage (HV) device includes a dielectric material composition different from that of the gate dielectric layers of other high-voltage (HV) devices. Also, the three high-voltage (HV) devices have different gate heights. Accordingly, as exemplified in FIG. 6, the high-voltage (HV) devices that are fabricated on the same semiconductor substrate 100 have different specific threshold voltages (Vt). That is, the specific threshold voltages of the high-voltage (HV) devices can be fine-tuned in accordance with some embodiments. Therefore, those high-voltage (HV) devices with specific threshold voltages can meet the electrical characteristic requirement, and also hit the sweet spot of the hot carrier injection (HCI) lifetime and the device resistance (such as on-resistance).

Figure 7A:
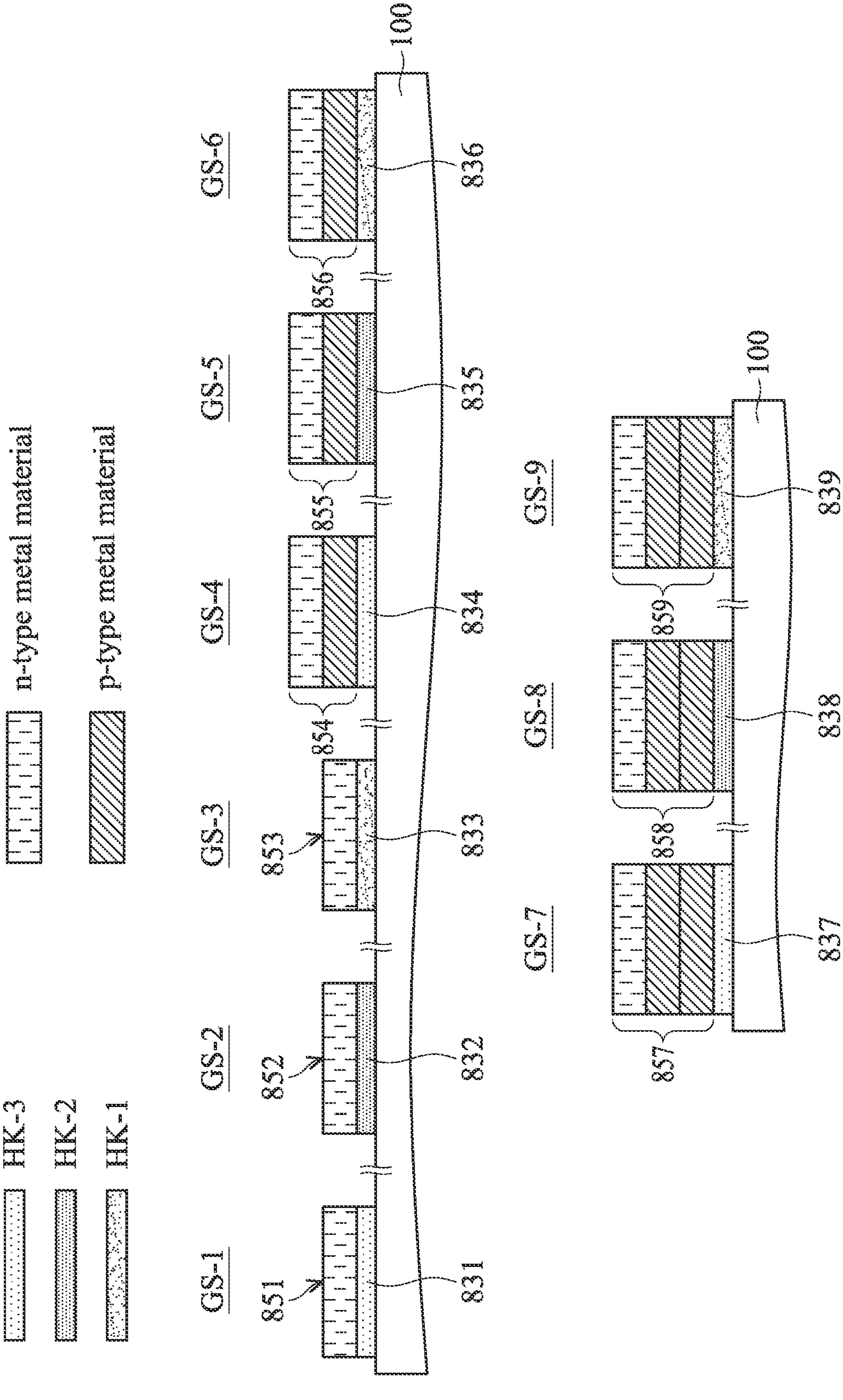
FIG. 7A illustrates cross-sectional views of different gate structures of the devices on a semiconductor substrate, in accordance with some embodiments of the present disclosure.

FIG. 7A illustrates cross-sectional views of different gate structures of the devices on a semiconductor substrate, in accordance with some embodiments of the present disclosure. In FIG. 7A, nine gate structures are provided, and only a single gate dielectric layer of each gate structure is depicted for the sake of simplicity of the drawing. It should be noted that the configurations of the gate structures merely provide some examples and the gate structures applicable in the present embodiment is not limited thereto. The gate dielectric layer of each gate structure may include a single dielectric material layer or a multi-layered structure of dielectric materials. In addition, the gate layer of each gate structure may include one or more conductive material layers. For example, the gate layer includes one n-type metal material, or further includes one or more p-type metal materials.

Referring to FIG. 7A, the gate structures GS-1, GS-2, GS-3, GS-4, GS-5, GS-6, GS-7, GS-8 and GS-9 are formed on the semiconductor substrate 100. The gate structures GS-1, GS-2, GS-3, GS-4, GS-5, GS-6, GS-7, GS-8 and GS-9 include the gate dielectric layers 831, 832, 833, 834, 835, 836, 837, 838 and 839, respectively. The gate structures GS-1, GS-2, GS-3, GS-4, GS-5, GS-6, GS-7, GS-8 and GS-9 include the gate layers 851, 852, 853, 854, 855, 856, 857, 858 and 859, respectively.

In this exemplified example, three different gate dielectric materials HK-1, HK-2 and HK-3 are implemented in those gate dielectric layers. That is, each of the gate dielectric layers 831, 834 and 837 includes the gate dielectric material HK-1. Each of the gate dielectric layers 832, 835 and 838 includes the gate dielectric material HK-2. Each of the gate dielectric layers 833, 836 and 839 includes the gate dielectric material HK-3.

In this exemplified example, three different combinations of the conductive material layers are implemented for providing different gate layers. For example, each of the gate layers 851, 852 and 853 includes one n-type metal material layer. Each of the gate layers 854, 855 and 856 includes one p-type metal material layer and one n-type metal material layer formed on the p-type metal material layer. Each of the gate layers 857, 858 and 859 includes two p-type metal material layers and one n-type metal material layer formed on the p-type metal material layers.

According to the gate structures as exemplified in FIG. 7A, the devices with the gate structures that are fabricated on the same semiconductor substrate 100 have nine different specific threshold voltages, such as Vt_1, Vt_2, Vt_3, Vt_4, Vt_5, Vt_6, Vt_7, Vt_8 and Vt_9. Those specific threshold voltages of the high-voltage (HV) devices can be controlled and fine-tuned by implementing different dielectric material compositions for forming the gate dielectric layers of different devices, in accordance with some embodiments. In some embodiments, different combinations of conductive material layers are further implemented in the formation of the gate layers, thereby forming the devices with its own specific threshold voltages.

Figure 7B:
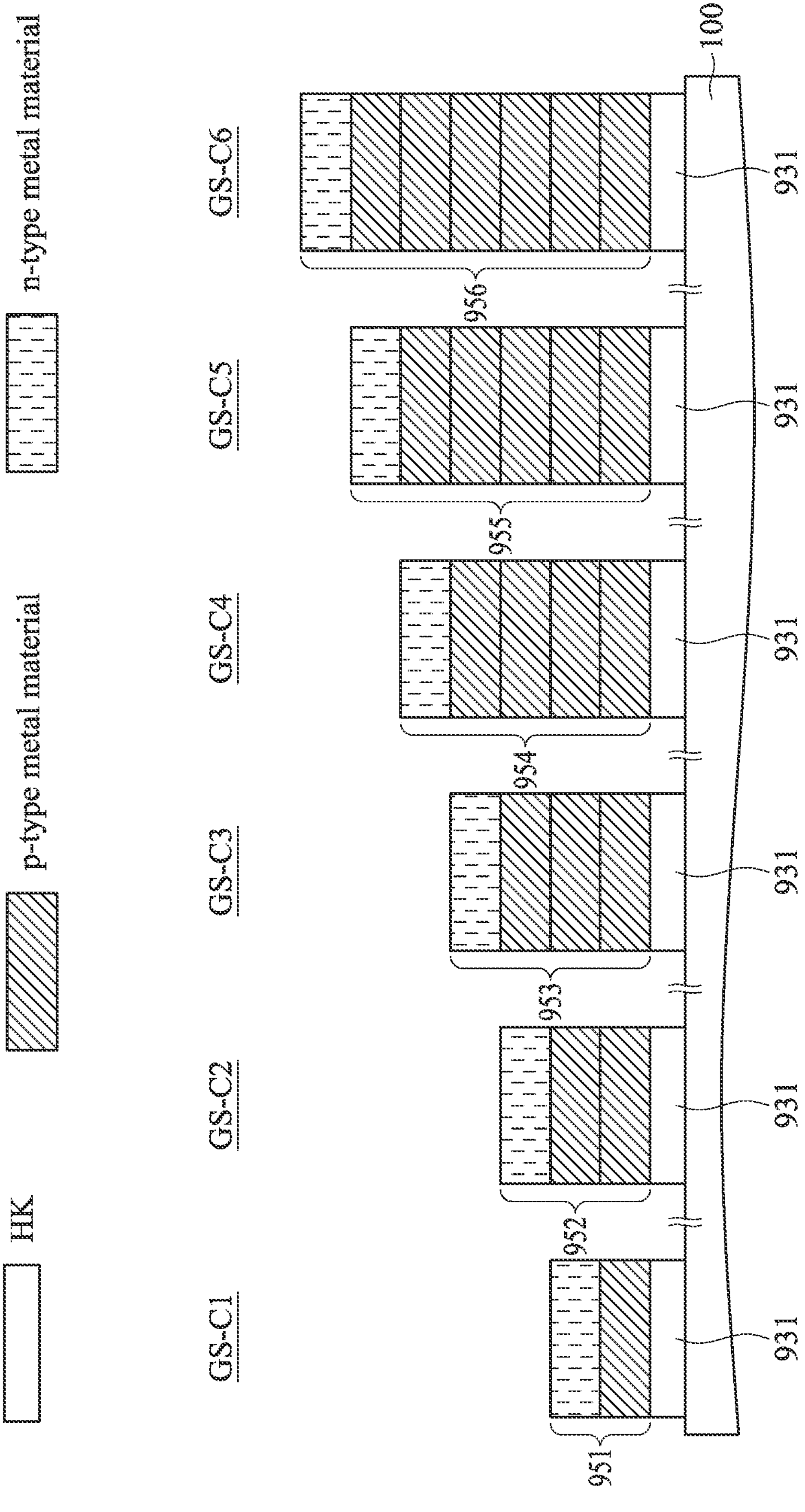
FIG. 7B illustrates cross-sectional views of different gate structures of conventional devices on a semiconductor substrate.

FIG. 7B illustrates cross-sectional views of different gate structures of conventional devices on a semiconductor substrate. Conventionally, the gate dielectric layers of the devices that are fabricated on the same semiconductor substrate 100' are made of the same dielectric material composition. For example, each of the gate dielectric layers 931 of the gate structures GS-C1, GS-C2, GS-C3, GS-C4, GS-C5 and GS-C6 includes the same gate dielectric material HK. The specific threshold voltages of the devices, such as the threshold voltages Vt_C1, Vt_C2, Vt_C3, Vt_C4, Vt_C5 and Vt_C6, are controlled by the materials and configurations of the gate layers 951, 952, 953, 954, 955 and 956, respectively. In FIG. 7B, the gate layer 951 of the gate structure GS-C1 includes one p-type metal material layer and one n-type metal material layer formed on the p-type metal material layer. The gate layer 952 of the gate structure GS-C2 includes two p-type metal material layers and one n-type metal material layer formed on the p-type metal material layers. The gate layer 953 of the gate structure GS-C3 includes three p-type metal material layers and one n-type metal material layer formed on the p-type metal material layers. The gate layer 954 of the gate structure GS-C4 includes four p-type metal material layers and one n-type metal material layer formed on the p-type metal material layers. The gate layer 955 of the gate structure GS-C5 includes five p-type metal material layers and one n-type metal material layer formed on the p-type metal material layers. The gate layer 956 of the gate structure GS-C6 includes six p-type metal material layers and one n-type metal material layer formed on the p-type metal material layers. Since the threshold voltage is adjusted by the number of conductive material layers of the gate layer, it is difficult to tune the threshold voltages of those conventional devices delicately based on the conventional design of the gate structures GS-C1, GS-C2, GS-C3, GS-C4, GS-C5 and GS-C6. In addition, the process for forming the conventional gate structure (e.g. GS-C1, GS-C2, GS-C3, GS-C4, GS-C5 and GS-C6), especially the high-k metal gate (HKMG) structure, is complicated, which leads to mismatch between the conductive material layers (e.g. the metal material layers) in a stack of the gate structure.

FIG. 8 shows a trade-off between hot carrier injection (HCI) lifetime and device resistance of a high-voltage (HV) semiconductor device. Generally, the hot carrier injection (HCI) lifetime decreases as the threshold voltage (Vt) of the semiconductor device increases. Also, the device resistance (such as on-resistance; Ron) increases as the threshold voltage (Vt) of the semiconductor device increases. Curve Css represents a sweet spot curve of the hot carrier injection (HCI) lifetime and the device resistance (such as on-resistance). The nine different specific threshold voltages of the devices (FIG. 7A) in the embodiments, such as Vt_1, Vt_2, Vt_3, Vt_4, Vt_5, Vt_6, Vt_7, Vt_8 and Vt_9, as described above are labelled on the curve Css in FIG. 8. The sixth different specific threshold voltages of the conventional devices (FIG. 7B), such as Vt_C1, Vt_C2, Vt_C3, Vt_C4, Vt_C5 and Vt_C6, as described above are also labelled on the curve Css in FIG. 8.

FIG. 8 clearly shows that the threshold voltages of the high-voltage (HV) devices can be fine-tuned by forming the gate dielectric layers with different dielectric material compositions or further forming the gate layers with different combinations of conductive material layers. According to the devices in FIG. 7A and FIG. 7B and the threshold voltages labelled on the curve Css in FIG. 8, the difference between the threshold voltages Vt_1 and Vt_2 is less than the difference between the threshold voltages Vt_C1 and Vt_C2. The difference between the threshold voltages Vt_3 and Vt_4 is less than the difference between the threshold voltages Vt_C2 and Vt_C3. The difference between the threshold voltages Vt_5 and Vt_6 is less than the difference between the threshold voltages Vt_C3 and Vt_C4. The difference between the threshold voltages Vt_8 and Vt_9 is less than the difference between the threshold voltages Vt_C5 and Vt_C6. Therefore, the specific threshold voltages of the high-voltage (HV) devices in accordance with some embodiments can be fine-tuned. According to the embodiments, those high-voltage (HV) devices with specific threshold voltages can be formed to meet the electrical characteristic requirement and also hit the sweet spot of the hot carrier injection (HCI) lifetime and the device resistance (such as on-resistance).

According to some embodiments described above, the semiconductor device structure and method of forming the same achieve several advantages. In some embodiments, the gate dielectric layer with suitable dielectric materials (such as one or more high-k dielectric materials) is implemented in each of the gate structures of the devices prevents the hot carrier injection (HCI) effect, thereby improving the electrical characteristics of the devices. Also, in some embodiments, different threshold voltages (Vt) of the devices (such as high-voltage devices) that are fabricated on the same semiconductor substrate 100 can be fine-tuned by adjusting the material composition and the dielectric constant of each of the gate dielectric layers of the devices. According to the embodiments, each of the devices can be operated in a suitable window of the hot carrier injection (HCI) lifetime and device resistance by flexible threshold voltages (Vt) offering, in accordance with some embodiments of the present disclosure. That is, by forming the gate layers with different gate dielectric layers (having different dielectric material compositions and its own dielectric constants) in some embodiments, the semiconductor devices could have specific threshold voltages (Vt) that not only meet the design requirement (i.e. have good electrical characteristics) but also hit the sweet spot of the hot carrier injection (HCI) lifetime and the device resistance. In addition, the semiconductor device structure and method of forming the same, in accordance with some embodiments, reduces the process complexity for forming the gate structure, thereby solving the conventional mismatch issue of the features (e.g. the mismatch between the conductive material layers in a stack of the gate structure) and improving the electrical characteristics of the devices.

It should be noted that the details of the structures and fabrications of the embodiments are provided for exemplification, and the described details of the embodiments are not intended to limit the present disclosure. It should be noted that not all embodiments of the invention are shown. Modifications and variations can be made without departing from the spirit of the disclosure to meet the requirements of the practical applications. Thus, there may be other embodiments of the present disclosure which are not specifically illustrated. Furthermore, the accompanying drawings are simplified for clear illustrations of the embodiment. Sizes and proportions in the drawings may not be directly proportional to actual products. Thus, the specification and the drawings are to be regard as an illustrative sense rather than a restrictive sense.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device structure, comprising:

a semiconductor substrate;

a first device formed in a first region of the semiconductor substrate, the first device comprising a first gate structure on the semiconductor substrate, wherein the first gate structure comprises:

a first gate dielectric layer on the semiconductor substrate, wherein the first gate dielectric layer is a single dielectric material layer; and a first gate layer on the first gate dielectric layer; and a second device formed in a second region of the semiconductor substrate, the second device comprising a second gate structure on the semiconductor substrate, wherein the second gate structure comprises:

a second gate dielectric layer on the semiconductor substrate; and a second gate layer on the second gate dielectric layer, wherein the first gate dielectric layer of the first device and the second gate dielectric layer of the second device have different dielectric material compositions, wherein the second gate dielectric layer comprises a hafnium oxide (HfOx) layer and a lanthanum oxide (LaOx) layer stacked in sequence over the substrate;

a third device formed in a third region of the semiconductor substrate, the third device comprising a third gate structure on the semiconductor substrate, wherein the third gate structure comprises:

a third gate dielectric layer on the semiconductor substrate; and a third gate layer on the third gate dielectric layer, wherein the third gate dielectric layer and the first gate dielectric layer have different dielectric material compositions, and the third gate dielectric layer and the second gate dielectric layer have different dielectric material compositions, wherein the third gate dielectric layer comprises a hafnium oxide (HfOx) layer, a first lanthanum oxide (LaOx) layer, and a second lanthanum oxide (LaOx) layer stacked in sequence over the substrate.

2. The semiconductor device structure as claimed in claim 1, wherein the first gate dielectric layer has a first dielectric constant, the second gate dielectric layer has a second dielectric constant, and the first dielectric constant is different from the second dielectric constant.

3. The semiconductor device structure as claimed in claim 1, wherein the first device and the second device are high-voltage metal oxide semiconductor (MOS) devices.

4. The semiconductor device structure as claimed in claim 1, wherein a first dielectric constant of the first gate dielectric layer and a second dielectric constant of the second gate dielectric layer are equal to or greater than 20.

5. The semiconductor device structure as claimed in claim 4, wherein the second dielectric constant of the second gate dielectric layer is greater than the first dielectric constant of the first gate dielectric layer.

6. The semiconductor device structure as claimed in claim 1, wherein the first gate dielectric layer has a first thickness, the second gate dielectric layer has a second thickness, and the first thickness is equal to the second thickness.

7. The semiconductor device structure as claimed in claim 1, wherein the first gate dielectric layer has a first thickness, the second gate dielectric layer has a second thickness, and the first thickness is different from the second thickness.

8. The semiconductor device structure as claimed in claim 1, wherein a first thickness of the first gate dielectric layer is in a range from 1 angstrom to 50 angstrom, and a second thickness of the second gate dielectric layer is in a range from 1 angstrom to 50 angstrom.

9. The semiconductor device structure as claimed in claim 1, wherein the second gate dielectric layer comprises multiple dielectric material layers.

10. The semiconductor device structure as claimed in claim 9, wherein the first gate dielectric layer and the second gate dielectric layer have a different number of the dielectric material layers.

11. The semiconductor device structure as claimed in claim 9, wherein the first gate dielectric layer and the second gate dielectric layer include the same number of the dielectric material layers.

12. The semiconductor device structure as claimed in claim 1, wherein the first gate layer of the first gate structure is a single n-type metal material layer, and the second gate layer of the second gate structure comprises multiple conductive material layers.

13. The semiconductor device structure as claimed in claim 1, wherein each of the first gate layer of the first gate structure and the second gate layer of the second gate structure comprises multiple conductive material layers.

14. The semiconductor device structure as claimed in claim 13, wherein the first gate layer of the first gate structure and the second gate layer of the second gate structure have a different number of the conductive material layers.

15. The semiconductor device structure as claimed in claim 13, wherein the first gate layer of the first gate structure and the second gate layer of the second gate structure include the same number of the conductive material layers.

16. The semiconductor device structure as claimed in claim 13, wherein the first gate layer of the first gate structure and the second gate layer of the second gate structure each comprises:

one or more p-type conductive material layers formed above the semiconductor substrate; and a n-type metal material layer formed on the one or more p-type conductive material layers.

17. The semiconductor device structure as claimed in claim 16, wherein a thickness of the p-type metal material layer is in a range from 1 angstrom to 50 angstrom, and a thickness of the n-type metal material layer is in a range from 1 angstrom to 500 angstrom.

18. The semiconductor device structure as claimed in claim 1, wherein the first gate dielectric layer includes hafnium oxide (HfOx), lanthanum oxide (LaOx), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof.

19. The semiconductor device structure as claimed in claim 1, wherein the first gate dielectric layer has a first dielectric constant, the second gate dielectric layer has a second dielectric constant, and the third gate dielectric layer has a third dielectric constant, wherein the first dielectric constant, the second dielectric constant, and the third dielectric constant are different from each other.

20. The semiconductor device structure as claimed in claim 1, wherein each of the first dielectric constant, the second dielectric constant, and the third dielectric constant is equal to or greater than 20.

21. The semiconductor device structure as claimed in claim 1, wherein the first gate dielectric layer has a first thickness, the second gate dielectric layer has a second thickness, and the third gate dielectric layer has a third thickness, wherein the first thickness, the second thickness and the third thickness are different from each other.

22. The semiconductor device structure as claimed in claim 1, wherein at least one of the first gate dielectric layer, the second gate dielectric layer, and the third gate dielectric layer comprises multiple dielectric material layers.

23. The semiconductor device structure as claimed in claim 22, wherein the third gate dielectric layer and the second gate dielectric layer have a different number of the dielectric material layers.

24. The semiconductor device structure as claimed in claim 1, wherein one of the first gate layer, the second gate layer, and the third gate layer is a single n-type metal material layer, and the other gate layers comprise multiple conductive material layers.

25. The semiconductor device structure as claimed in claim 1, wherein the first gate layer, the second gate layer, and the third gate layer each has a different number of conductive material layers.

26. The semiconductor device structure as claimed in claim 1, wherein the first device further comprises a first source region and a first drain region at opposite sides of the first gate structure, and the second device further comprises a second source region and a second drain region at opposite sides of the second gate structure.

27. The semiconductor device structure as claimed in claim 1, wherein the first gate dielectric layer is in direct contact with the substrate, and the first gate dielectric layer has a dielectric constant equal to or greater than 20.

28. A method of forming a semiconductor device structure, comprising:

providing a semiconductor substrate having a first region and a second region; and forming a first device in the first region and a second device in the second region, wherein the first device comprises a first gate structure on the semiconductor substrate, the second device comprises a second gate structure on the semiconductor substrate, and forming the first gate structure comprises:

forming a first gate dielectric layer on the semiconductor substrate; and forming a first gate layer on the first gate dielectric layer; and forming the second gate structure comprises:

forming a second gate dielectric layer on the semiconductor substrate; and forming a second gate layer on the second gate dielectric layer, wherein the first gate dielectric layer of the first device and the second gate dielectric layer of the second device have different dielectric material compositions;

forming a third device in a third region of the semiconductor substrate, the third device comprising a third gate structure on the semiconductor substrate, wherein forming the third gate structure comprises:

forming a third gate dielectric layer on the semiconductor substrate; and forming a third gate layer on the third gate dielectric layer, wherein the third gate dielectric layer and the first gate dielectric layer have different dielectric material compositions, and the third gate dielectric layer and the second gate dielectric layer have different dielectric material compositions, wherein the third gate dielectric layer comprises a hafnium oxide (HfOx) layer, a first lanthanum oxide (LaOx) layer, and a second lanthanum oxide (LaOx) layer stacked in sequence over the substrate.

29. The method of forming the semiconductor device structure as claimed in claim 28, wherein the first gate dielectric layer has a first dielectric constant, the second gate dielectric layer has a second dielectric constant, and the first dielectric constant is different from the second dielectric constant.

30. The method of forming the semiconductor device structure as claimed in claim 28, wherein the first device and the second device are high-voltage metal oxide semiconductor (MOS) devices.

31. The method of forming the semiconductor device structure as claimed in claim 28, wherein a first dielectric constant of the first gate dielectric layer and a second dielectric constant of the second gate dielectric layer are equal to or greater than 20.

32. The method of forming the semiconductor device structure as claimed in claim 31, wherein the second dielectric constant of the second gate dielectric layer is greater than the first dielectric constant of the first gate dielectric layer.

33. The method of forming the semiconductor device structure as claimed in claim 28, wherein the first gate dielectric layer has a first thickness, the second gate dielectric layer has a second thickness, and the first thickness is equal to the second thickness.

34. The method of forming the semiconductor device structure as claimed in claim 28, wherein the first gate dielectric layer has a first thickness, the second gate dielectric layer has a second thickness, and the first thickness is different from the second thickness.

35. The semiconductor device structure as claimed in claim 28, wherein the dielectric material layers of the second gate dielectric layer comprise different materials.

* * * * *